(12) United States Patent
Sakamoto et al.

(10) Patent No.: US 6,657,215 B2
(45) Date of Patent: Dec. 2, 2003

(54) APPARATUS FOR DETERMINING EXPOSURE CONDITIONS, METHOD FOR DETERMINING EXPOSURE CONDITIONS AND PROCESS APPARATUS

(75) Inventors: Kazuo Sakamoto, Kumamoto-ken (JP); Hideaki Hashiwagi, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 141 days.

(21) Appl. No.: 09/903,017

(22) Filed: Jul. 10, 2001

(65) Prior Publication Data

US 2002/0005496 A1 Jan. 17, 2002

(30) Foreign Application Priority Data

Jul. 11, 2000 (JP) ......................................... 2000-210081

(51) Int. Cl.$^7$ ............................................... G01N 21/86
(52) U.S. Cl. .......................................... 250/548; 355/53
(58) Field of Search .............................. 250/548, 201.2, 250/559.29, 559.3; 355/53, 54; 430/30, 327

(56) References Cited

U.S. PATENT DOCUMENTS 5,968,691 A * 10/1999 Yoshioka et al. ............ 430/30
6,027,842 A * 2/2000 Ausschnitt et al. .......... 430/30
6,403,291 B1 * 6/2002 Kawashima et al. ........ 430/394

* cited by examiner

Primary Examiner—Kevin Pyo
Assistant Examiner—Seung C. Sohn
(74) Attorney, Agent, or Firm—Rader, Fishman & Grauer PLLC

(57) ABSTRACT

In an apparatus for determining the exposure conditions, a developed pattern is converted into an optical information formed by exposing a plurality of different positions of a substrate at different exposure amounts and focus values to light at a predetermined pattern and developing the pattern thereby to determine the combination of the optimum exposure amount and the optimum focus value from the optical information. To be more specific, the apparatus for determining the exposure conditions includes a light irradiating section for irradiating a predetermined range of the developed pattern formed on the substrate such as a semiconductor wafer with light having a predetermined intensity, a detecting section for measuring the reflected light intensity of the predetermined range irradiated with light having the predetermined intensity, and an arithmetic process section for searching the position where the exposure treatment has been performed with an appropriate exposure amount and an appropriate focus value from the reflected light intensity thereby to determine the exposure conditions.

27 Claims, 16 Drawing Sheets

|     | X1 | X2 | X3 | X4 | X5 | X6 | X7 | X8 | X9 | X10 | X11 |
|-----|----|----|----|----|----|----|----|----|----|-----|-----|
| Y1  | 70 | 70 | 70 | 50 | 50 | 50 | 50 | 50 | 50 | 30  | 30  |
| Y2  | 70 | 70 | 70 | 50 | 50 | 50 | 50 | 50 | 50 | 30  | 30  |
| Y3  | 70 | 70 | 70 | 50 | 50 | 50 | 50 | 50 | 50 | 30  | 30  |
| Y4  | 70 | 70 | 70 | 50 | 50 | 50 | 30 | 30 | 30 | 30  | 30  |
| Y5  | 70 | 70 | 70 | 50 | 50 | 30 | 20 | 20 | 20 | 20  | 20  |
| Y6  | 70 | 70 | 50 | 50 | 50 | 30 | 20 | 20 | 20 | 5   | 5   |
| Y7  | 70 | 70 | 70 | 50 | 50 | 30 | 20 | 20 | 20 | 20  | 20  |
| Y8  | 70 | 70 | 70 | 50 | 50 | 50 | 30 | 30 | 30 | 30  | 30  |
| Y9  | 70 | 70 | 70 | 50 | 50 | 50 | 50 | 50 | 50 | 30  | 30  |
| Y10 | 70 | 70 | 70 | 50 | 50 | 50 | 50 | 50 | 50 | 30  | 30  |
| Y11 | 70 | 70 | 70 | 50 | 50 | 50 | 50 | 50 | 50 | 30  | 30  |

FIG.10A    LOWER WIDTH RATIO (Qb)

|     | X1 | X2 | X3 | X4 | X5 | X6 | X7 | X8 | X9 | X10 | X11 |
|-----|----|----|----|----|----|----|----|----|----|-----|-----|
| Y1  | 70 | 70 | 70 | 50 | 50 | 50 | 50 | 50 | 50 | 30  | 30  |
| Y2  | 70 | 70 | 70 | 50 | 50 | 50 | 50 | 50 | 50 | 30  | 30  |
| Y3  | 70 | 70 | 70 | 50 | 50 | 50 | 50 | 50 | 50 | 30  | 30  |
| Y4  | 70 | 70 | 70 | 50 | 50 | 50 | 50 | 50 | 50 | 30  | 30  |
| Y5  | 70 | 70 | 70 | 70 | 70 | 70 | 50 | 50 | 30 | 30  | 30  |
| Y6  | 80 | 80 | 80 | 80 | 80 | 80 | 70 | 70 | 50 | 30  | 30  |
| Y7  | 70 | 70 | 70 | 70 | 70 | 70 | 50 | 50 | 30 | 30  | 30  |
| Y8  | 70 | 70 | 70 | 50 | 50 | 50 | 50 | 50 | 50 | 30  | 30  |
| Y9  | 70 | 70 | 70 | 50 | 50 | 50 | 50 | 50 | 50 | 30  | 30  |
| Y10 | 70 | 70 | 70 | 50 | 50 | 50 | 50 | 50 | 50 | 30  | 30  |
| Y11 | 70 | 70 | 70 | 50 | 50 | 50 | 50 | 50 | 50 | 30  | 30  |

FIG.10B    UPPER WIDTH RATIO (Qt)

|     | X1 | X2 | X3 | X4 | X5 | X6 | X7 | X8 | X9 | X10 | X11 |
|-----|----|----|----|----|----|----|----|----|----|-----|-----|
| Y1  | 0  | 0  | 0  | 0  | 0  | 0  | 0  | 0  | 0  | 0   | 0   |
| Y2  | 0  | 0  | 0  | 0  | 0  | 0  | 0  | 0  | 0  | 0   | 0   |
| Y3  | 0  | 0  | 0  | 0  | 0  | 0  | 0  | 0  | 0  | 0   | 0   |
| Y4  | 0  | 0  | 0  | 0  | 0  | 0  | 20 | 20 | 20 | 0   | 0   |
| Y5  | 0  | 0  | 0  | 20 | 20 | 40 | 30 | 30 | 10 | 10  | 10  |
| Y6  | 10 | 10 | 30 | 30 | 30 | 50 | 50 | 50 | 30 | 25  | 25  |
| Y7  | 0  | 0  | 0  | 20 | 20 | 40 | 30 | 30 | 10 | 10  | 10  |
| Y8  | 0  | 0  | 0  | 0  | 0  | 0  | 20 | 20 | 20 | 0   | 0   |
| Y9  | 0  | 0  | 0  | 0  | 0  | 0  | 0  | 0  | 0  | 0   | 0   |
| Y10 | 0  | 0  | 0  | 0  | 0  | 0  | 0  | 0  | 0  | 0   | 0   |
| Y11 | 0  | 0  | 0  | 0  | 0  | 0  | 0  | 0  | 0  | 0   | 0   |

UPPER WIDTH RATIO (Qt) − LOWER WIDTH RATIO (Qb)

FIG.10C

|    | X1 | X2 | X3 | X4 | X5 | X6 | X7 | X8 | X9 | X10 | X11 |
|----|----|----|----|----|----|----|----|----|----|-----|-----|
| Y1 |    |    |    |    |    |    |    |    |    |     |     |
| Y2 |    |    |    |    |    |    |    |    |    |     |     |
| Y3 |    |    |    |    |    |    |    |    |    |     |     |
| Y4 |    |    |    |    | 50 | 50 | 30 |    |    |     |     |
| Y5 |    |    |    |    | 50 | 50 | 30 |    |    |     |     |
| Y6 |    |    |    |    | 50 | 50 | 30 |    |    |     |     |
| Y7 |    |    |    |    | 50 | 50 | 50 |    |    |     |     |
| Y8 |    |    |    |    | 50 | 50 | 50 |    |    |     |     |
| Y9 |    |    |    |    |    |    |    |    |    |     |     |
| Y10|    |    |    |    |    |    |    |    |    |     |     |
| Y11|    |    |    |    |    |    |    |    |    |     |     |

FIG.12A     LOWER WIDTH RATIO (Qb)

|    | X1 | X2 | X3 | X4 | X5 | X6 | X7 | X8 | X9 | X10 | X11 |
|----|----|----|----|----|----|----|----|----|----|-----|-----|
| Y1 |    |    |    |    |    |    |    |    |    |     |     |
| Y2 |    |    |    |    |    |    |    |    |    |     |     |
| Y3 |    |    |    |    |    |    |    |    |    |     |     |
| Y4 |    |    |    |    | 70 | 70 | 70 |    |    |     |     |
| Y5 |    |    |    |    | 80 | 80 | 80 |    |    |     |     |
| Y6 |    |    |    |    | 70 | 70 | 70 |    |    |     |     |
| Y7 |    |    |    |    | 50 | 50 | 50 |    |    |     |     |
| Y8 |    |    |    |    | 50 | 50 | 50 |    |    |     |     |
| Y9 |    |    |    |    |    |    |    |    |    |     |     |
| Y10|    |    |    |    |    |    |    |    |    |     |     |
| Y11|    |    |    |    |    |    |    |    |    |     |     |

FIG.12B     UPPER WIDTH RATIO (Qt)

|    | X1 | X2 | X3 | X4 | X5 | X6 | X7 | X8 | X9 | X10 | X11 |
|----|----|----|----|----|----|----|----|----|----|-----|-----|
| Y1 |    |    |    |    |    |    |    |    |    |     |     |
| Y2 |    |    |    |    |    |    |    |    |    |     |     |
| Y3 |    |    |    |    |    |    |    |    |    |     |     |
| Y4 |    |    |    |    | 20 | 20 | 40 |    |    |     |     |
| Y5 |    |    |    |    | 30 | 30 | 50 |    |    |     |     |
| Y6 |    |    |    |    | 20 | 20 | 40 |    |    |     |     |
| Y7 |    |    |    |    | 0  | 0  | 0  |    |    |     |     |
| Y8 |    |    |    |    | 0  | 0  | 0  |    |    |     |     |
| Y9 |    |    |    |    |    |    |    |    |    |     |     |
| Y10|    |    |    |    |    |    |    |    |    |     |     |
| Y11|    |    |    |    |    |    |    |    |    |     |     |

UPPER WIDTH RATIO (Qt) − LOWER WIDTH RATIO (Qb)

FIG.12C

|    | X1 | X2 | X3 | X4 | X5 | X6 | X7 | X8 | X9 | X10 | X11 |
|----|----|----|----|----|----|----|----|----|----|-----|-----|
| Y1 |    |    |    |    |    |    |    |    |    |     |     |
| Y2 |    |    |    |    |    |    |    |    |    |     |     |
| Y3 |    |    |    |    |    |    |    |    |    |     |     |
| Y4 |    |    |    |    |    |    | 50 | 50 |    |     |     |
| Y5 |    |    |    |    |    | 50 | 50 | 30 | 20 | 20  |     |
| Y6 |    |    |    |    | 50 | 50 | 30 | 30 | 30 |     |     |
| Y7 |    |    |    |    |    |    | 30 |    |    |     |     |
| Y8 |    |    |    |    |    |    |    |    |    |     |     |
| Y9 |    |    |    |    |    |    |    |    |    |     |     |
| Y10|    |    |    |    |    |    |    |    |    |     |     |
| Y11|    |    |    |    |    |    |    |    |    |     |     |

FIG.13A  LOWER WIDTH RATIO (Qb)

|    | X1 | X2 | X3 | X4 | X5 | X6 | X7 | X8 | X9 | X10 | X11 |
|----|----|----|----|----|----|----|----|----|----|-----|-----|
| Y1 |    |    |    |    |    |    |    |    |    |     |     |
| Y2 |    |    |    |    |    |    |    |    |    |     |     |
| Y3 |    |    |    |    |    |    |    |    |    |     |     |
| Y4 |    |    |    |    |    |    | 70 | 70 |    |     |     |
| Y5 |    |    |    |    |    | 80 | 80 | 80 | 70 | 50  |     |
| Y6 |    |    |    |    | 70 | 70 | 70 | 70 | 50 |     |     |
| Y7 |    |    |    |    |    |    | 50 |    |    |     |     |
| Y8 |    |    |    |    |    |    |    |    |    |     |     |
| Y9 |    |    |    |    |    |    |    |    |    |     |     |
| Y10|    |    |    |    |    |    |    |    |    |     |     |
| Y11|    |    |    |    |    |    |    |    |    |     |     |

FIG.13B  UPPER WIDTH RATIO (Qt)

|    | X1 | X2 | X3 | X4 | X5 | X6 | X7 | X8 | X9 | X10 | X11 |
|----|----|----|----|----|----|----|----|----|----|-----|-----|
| Y1 |    |    |    |    |    |    |    |    |    |     |     |
| Y2 |    |    |    |    |    |    |    |    |    |     |     |
| Y3 |    |    |    |    |    |    |    |    |    |     |     |
| Y4 |    |    |    |    |    |    | 20 | 20 |    |     |     |
| Y5 |    |    |    |    |    | 30 | 30 | 50 | 50 | 30  |     |
| Y6 |    |    |    |    | 20 | 20 | 40 | 40 | 20 |     |     |
| Y7 |    |    |    |    |    |    | 20 |    |    |     |     |
| Y8 |    |    |    |    |    |    |    |    |    |     |     |
| Y9 |    |    |    |    |    |    |    |    |    |     |     |
| Y10|    |    |    |    |    |    |    |    |    |     |     |
| Y11|    |    |    |    |    |    |    |    |    |     |     |

UPPER WIDTH RATIO (Qt) − LOWER WIDTH RATIO (Qb)

FIG.13C

APPARATUS FOR DETERMINING EXPOSURE CONDITIONS, METHOD FOR DETERMINING EXPOSURE CONDITIONS AND PROCESS APPARATUS

BACKGROUND OF THE INVENTION

1. Field of the Invention

The present invention relates to an apparatus for determining the exposure conditions in, for example, a photolithography step included in a manufacturing process of a semiconductor device, a method of determining the exposure conditions, and a process apparatus equipped with the apparatus for determining the exposure conditions.

2. Description of the Related Art

In, for example, the photolithography step included in a manufacturing process of a semiconductor device, a resist film is formed first on the surface of a semiconductor wafer, followed by subjecting the wafer to an exposure treatment in which the resist film is selectively exposed to light in a predetermined pattern and subsequently subjecting the exposed wafer to a developing treatment so as to form a predetermined pattern on the wafer.

Prior to the exposure treatment, performed is an operation called the operation for determining the exposure conditions for setting the exposure amount and the focus value at optimum values. The operation for determining the exposure conditions is performed because the conditions of the exposure apparatus such as the intensity and stability of the light source and length of the optical path are slightly changed, with the result that developed patterns having the identical shape accuracy is not always formed on the wafer even if the set values on the operating panel of the exposure apparatus are set constant. It follows that the operation for determining the exposure conditions is indispensable for forming a predetermined pattern on the article and, thus, the particular operation is performed periodically, e.g., at an interval of one week or one day.

In general, the operation for determining the exposure conditions is carried out as follows. Specifically, in the first step, a single wafer having a resist film formed thereon is selectively exposed to light in a predetermined pattern using a mask (reticle) having a predetermined pattern formed therein with, for example, the exposure amount changed in the column direction and with the focus value changed in the row direction. Then, the exposed wafer is subjected to a baking treatment, followed by further applying a developing treatment to the wafer. Further, the developed pattern thus obtained is observed with, for example, a scanning electron microscope (SEM). The exposure conditions giving the best developed pattern are determined on the basis of the result of the microscopic observation.

However, in the operation for determining the exposure conditions in which the line width of the fine pattern of the mask or the wafer is measured by a length measuring SEM, the operator is required to be sufficiently skilled in the operation of the length measuring SEM. Also, the time required for the judgment of the measured values differs depending on the operator. Such being the situation, a long time is required for determining the optimum exposure conditions so as to make it difficult to improve the production efficiency. The improvement in the production efficiency is also inhibited in the case where the selective judgment of the optimum exposure conditions differs depending on the operator and, thus, the exposure conditions are changed every time the exposure treatment is carried out.

It should also be noted that, in recent years, the exposure treatment is rendered complex so as to increase the number of steps of the operation for determining the exposure conditions, with the result that a long time is required for the operation for determining the exposure conditions. Under the circumstances, it is required to shorten the time for determining the exposure conditions. Further, in order to maintain a high quality of the article and to improve the product yield by finding promptly the disorder of the exposure apparatus and the change in the conditions, it is desirable to confirm on the real time basis whether the developed pattern obtained in the photolithography step has a predetermined shape accuracy.

BRIEF SUMMARY OF THE INVENTION

An object of the present invention is to provide a an apparatus for determining the exposure conditions, which permits improving the production efficiency by automating the operation to determine the exposure conditions so as to decrease the number of process steps and also permits maintaining the quality of the product, a method for determining the exposure conditions, and a process apparatus equipped with the apparatus for determining the exposure conditions.

According to a first aspect of the present invention, there is provided an apparatus for determining the exposure conditions in the lithography step, comprising means for converting a developed pattern into an optical information formed by exposing a plurality of different positions of a substrate at different exposure amounts and focus values to light at a predetermined pattern and developing said pattern and for determining an optimum combination of the exposure amount and the focus value based on said optical information.

According to a second aspect of the present invention, there is provided an apparatus for determining the exposure conditions, in which the operation to determine the exposure conditions is performed by using a substrate being exposed in a plurality of different positions thereof at different exposure amounts and focus values to light at a predetermined pattern by using a mask having said predetermined pattern formed therein, and, then, being developed, comprising a light irradiating section for irradiating a predetermined range of the developed pattern formed on the substrate with light having a predetermined intensity; a detecting section for detecting the optical information of a predetermined region within said predetermined range; and an arithmetic process section for searching the position where the exposure treatment has been applied under an optimum exposure amount and focus value from said optical information thereby to determine the optimum exposure conditions.

According to a third aspect of the present invention, there is provided a method for determining the exposure conditions in the photolithography step, comprising a first step of exposing a plurality of different positions of a substrate at different exposure amounts and focus values to light at a predetermined pattern; a second step of converting the state of the developed pattern formed by developing said substrate into an optical information; and a third step of determining an optimum combination of the exposure amount and the focus value based on said optical information.

According to a fourth aspect of the present invention, there is provided a method for determining the exposure conditions in the photolithography step, comprising a first step of exposing a plurality of different positions of a substrate at different exposure amounts and focus values to light at a predetermined pattern by using a mask having said predetermined pattern formed therein; a second step of forming a developed pattern by developing the substrate; a third step of irradiating a predetermined range of said developed pattern with light having a predetermined intensity thereby to measure the optical information on the light reflected from irradiated portion; and a fourth step of comparing said optical information with reference data prepared in advance and including information obtained by the visual observation and optical information thereby to determine the optimum light exposure amount and the optimum focus value from the combinations of the light exposure amounts and the focus values employed in said first step.

According to a fifth aspect of the present invention, there is provided a method for determining the exposure conditions in the photolithography step, comprising a preparatory process and a main process, wherein said preparatory process includes a first preparatory step of exposing a plurality of different positions of a substrate at different exposure amounts and focus values to light at a predetermined pattern by using a mask having said predetermined pattern formed therein; a second preparatory step of forming a reference developed pattern by developing the substrate; a third preparatory step of observing said reference developed pattern with an SEM thereby to obtain information on the shape of said reference developed pattern; a fourth preparatory step of irradiating a predetermined range of said reference developed pattern with light having a predetermined intensity thereby to obtain information on the reflected light; and a fifth preparatory step of preparing reference data in which said information on the shape is correlated with the optical information obtained in said fourth preparatory step, and said main process includes a first step of forming a predetermined developed pattern on a substrate in accordance with the process similar to that in said first preparatory step and said second preparatory step; a second step of irradiating a predetermined range of said developed pattern with light having a predetermined intensity thereby to measure the optical information on the reflected light; and a third step of comparing said optical information with said reference data thereby to determine the optimum exposure amount and the optimum focus value from the combinations of the exposure amounts and the focus values employed in said first step.

According to a sixth aspect of the present invention, there is provided a process apparatus including a developing process section for applying a developing treatment to a substrate subjected to a exposure treatment, comprising an apparatus for determining the exposure conditions, in which a developed pattern is converted into an optical information formed by exposing a plurality of different positions of a substrate at different exposure amounts and focus values to light at a predetermined pattern and developing said pattern in said developing process section thereby to determine the optimum exposure amount and the optimum focus value based on said optical information.

According to a seventh aspect of the present invention, there is provided a process apparatus including a developing process section for applying a developing treatment to a substrate subjected to a exposure treatment, said process apparatus comprising an apparatus for determining the exposure conditions, in which the operation to determine the exposure conditions is performed by using a substrate being exposed in a plurality of different positions thereof at different exposure amounts and focus values to light at predetermined pattern by using a mask having said predetermined pattern formed therein, and, then, being developed in said developing process section, wherein said apparatus for determining the exposure conditions includes a light irradiating section for irradiating a predetermined range of said developed pattern formed on the substrate with light having a predetermined intensity; a detecting section for detecting the optical information of a predetermined region within said predetermined range; and an arithmetic process section for searching the position where the exposure treatment has been applied under the optimum exposure amount and the optimum focus value from said optical information thereby to determine the optimum exposure conditions.

According to an eighth aspect of the present invention, there is provided a process apparatus comprising a resist coating process section for forming a resist film on a substrate; a exposure apparatus for applying a exposure treatment to the substrate having said resist film formed thereon; a developing process section for applying a developing treatment to the substrate subjected to the exposure treatment by using said exposure apparatus; and an apparatus for determining the exposure conditions, in which a developed pattern into an optical information formed by exposing a plurality of different positions of a substrate at different exposure amounts and focus values to light at a predetermined pattern by using said exposure apparatus and the developing said pattern in said developing process section and for determining an optimum exposure amount and an optimum focus value based on said optical information and to feed back said optimum exposure amount and said optimum focus value to said exposure apparatus.

According to a ninth aspect of the present invention, there is provided a process apparatus comprising a resist coating process section for forming a resist film on a substrate; a developing process section for applying a developing treatment to the substrate subjected to the exposure treatment; and an apparatus for determining the exposure conditions, in which a developed pattern is converted into an optical information formed by exposing a plurality of different positions of the substrate having the resist film formed thereon at different exposure amounts and focus values to light at a predetermined pattern and developing said pattern in said developing process section thereby to determine the optimum exposure amount and the optimum focus value from said optical information.

According to a tenth aspect of the present invention, there is provided a process apparatus comprising a resist coating process section for forming a resist film on a substrate; a developing process section for applying a developing treatment to the substrate subjected to the exposure treatment; an optical information detecting section for detecting a developed pattern as an optical information formed by exposing a plurality of different positions of the substrate having a resist film formed thereon at different exposure amounts and focus values to light at a predetermined pattern and developing said pattern in said developing process section; and a coating-developing control section for determining the process conditions in said resist coating section and/or said developing process section from the optical information detected by said optical information detecting apparatus thereby to feed back said determined process conditions to said resist coating process section and/or said developing process section.

According to the present invention, the operation to determine the exposure conditions, which was performed in the past by the judgment of an operator on the basis of the result of the SEM observation, can be automatically performed by using an optical information such as the reflected light intensity, making it possible to decrease the number of process steps so as to improve the production efficiency. Also, it is possible perform easily the checking of the exposure conditions at a predetermined timing, e.g., at an interval of several hours, in addition to the operation to determine the exposure conditions performed every day or every week in the past, so as to make it possible to maintain a high quality of the product. It should also be noted that, when the optical information obtained in the operation to determine the exposure conditions is far apart from the reference date measured in advance, it is suggested that disorder has taken place in light exposure apparatus, the resist coating-developing process system performing a series of operations, and the apparatus for determining the exposure conditions. Therefore, it is possible to detect the disorder of these apparatuses in an early stage from the optical information so as to cope with the disorder.

It is possible to arrange the apparatus for determining the exposure conditions having above constitution in the box in which the process section for performing the resist coating and the developing treatment is arranged or within the exposure apparatus, making it possible to monitor the formed state of the developed pattern on the real time basis in parallel to the resist coating treatment, etc. It follows that it is possible to maintain a high quality of the product. It should also be noted that, if the apparatus for determining the exposure conditions is constructed such that an alarm is emitted in the case where the difference between the detected optical information and the reference data is large, it is possible to obtain an additional effect that the number of substrates that are rendered useless is decreased.

BRIEF DESCRIPTION OF THE SEVERAL VIEWS OF THE DRAWING

FIGS. 10A to 10C are matrices each showing the lower width ratio and the upper width ratio obtained under various exposure conditions as well as the difference between the lower width ratio and the upper width ratio;

FIGS. 12A to 12C are other matrices each showing the lower width ratio and the upper width ratio in respect of a part of the exposure conditions as well as the difference between the lower width ratio and the upper width ratio;

FIGS. 13A to 13C are matrices each showing the lower width ratio and the upper width ratio in respect of a part of the exposure conditions as well as the difference between the lower width ratio and the upper width ratio;

DETAILED DESCRIPTION OF THE INVENTION

Figure 1:
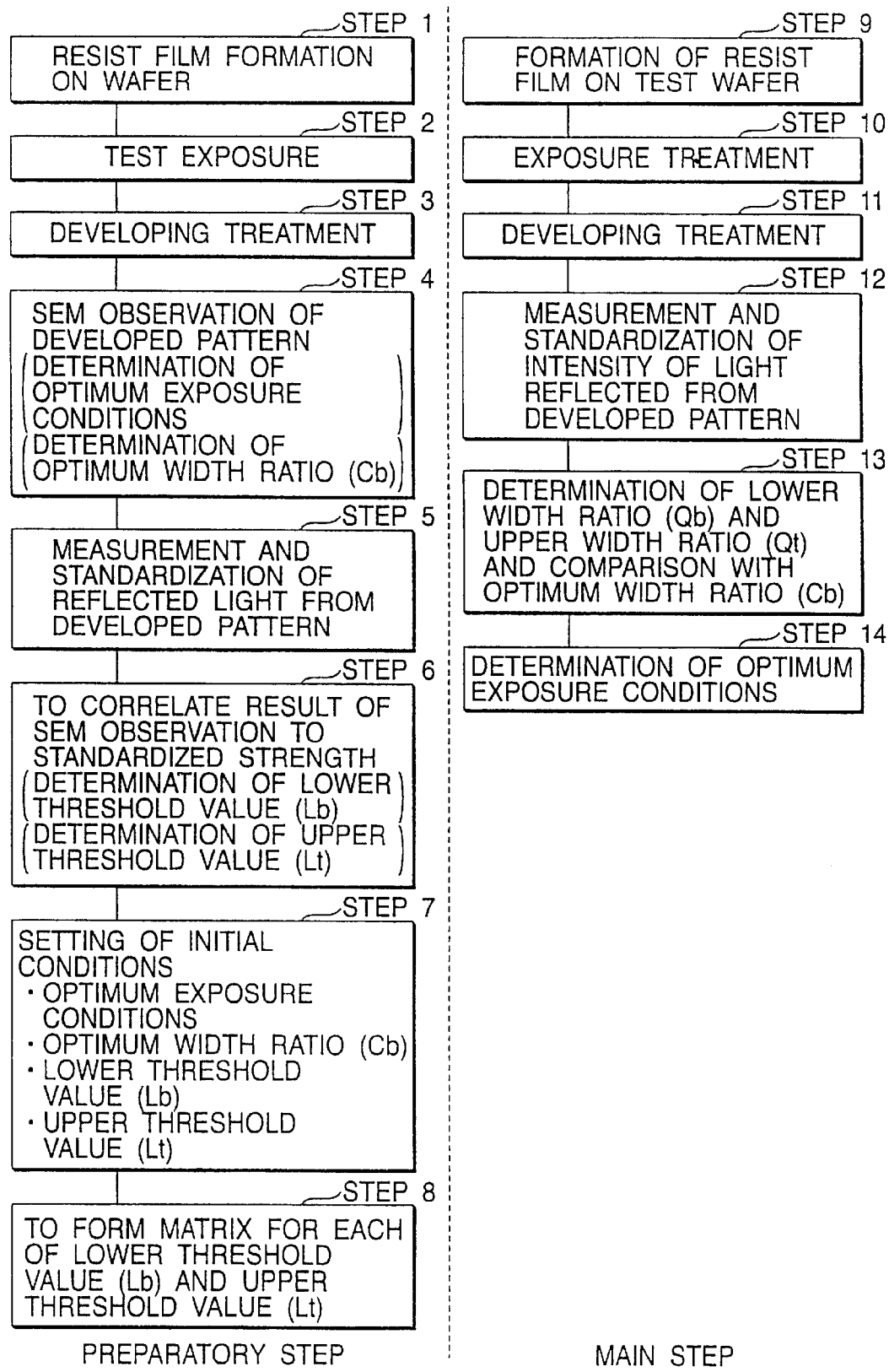
FIG. 1 is a flow chart showing the process of determining the exposure conditions by using the apparatus for determining the exposure conditions according to one embodiment of the present invention.

An embodiment of the present invention will now be described with reference to the accompanying drawings, with the photolithography step of a semiconductor wafer taken as an example. FIG. 1 is a flow chart showing the process for determining the exposure conditions by using an apparatus for determining the exposure conditions according to the present invention. The method of the present invention for determining the exposure conditions comprises a preparatory step shown in the left column of FIG. 1, and a main step shown in the right column of FIG. 1 for determining the exposure conditions by confirming the conditions of the exposure apparatus before applying a exposure treatment to an actual article for imparting an optimum developing pattern.

The preparatory step will now be described first. In determining the exposure conditions, prepared first is a wafer having a resist film formed thereon. After application of, for example, a dehumidifying treatment (HMDS treatment) for enhancing the fixing capability of the resist to the wafer, the wafer is coated with a resist solution so as to form a resist film on the water (step 1). For forming the resist film, employed is, for example, a method in which a resist solution is supplied to the central portion of the wafer while rotating a spin chuck having the wafer fixed thereto by vacuum suction at a predetermined angular speed so as to allow the resist solution to be centrifugally expanded toward the periphery of the wafer. After the resist attached to the back surface and peripheral portion of the wafer is removed, the wafer is subjected to a heat treatment, followed by cooling the wafer so as to fix the resist film.

Figure 2:
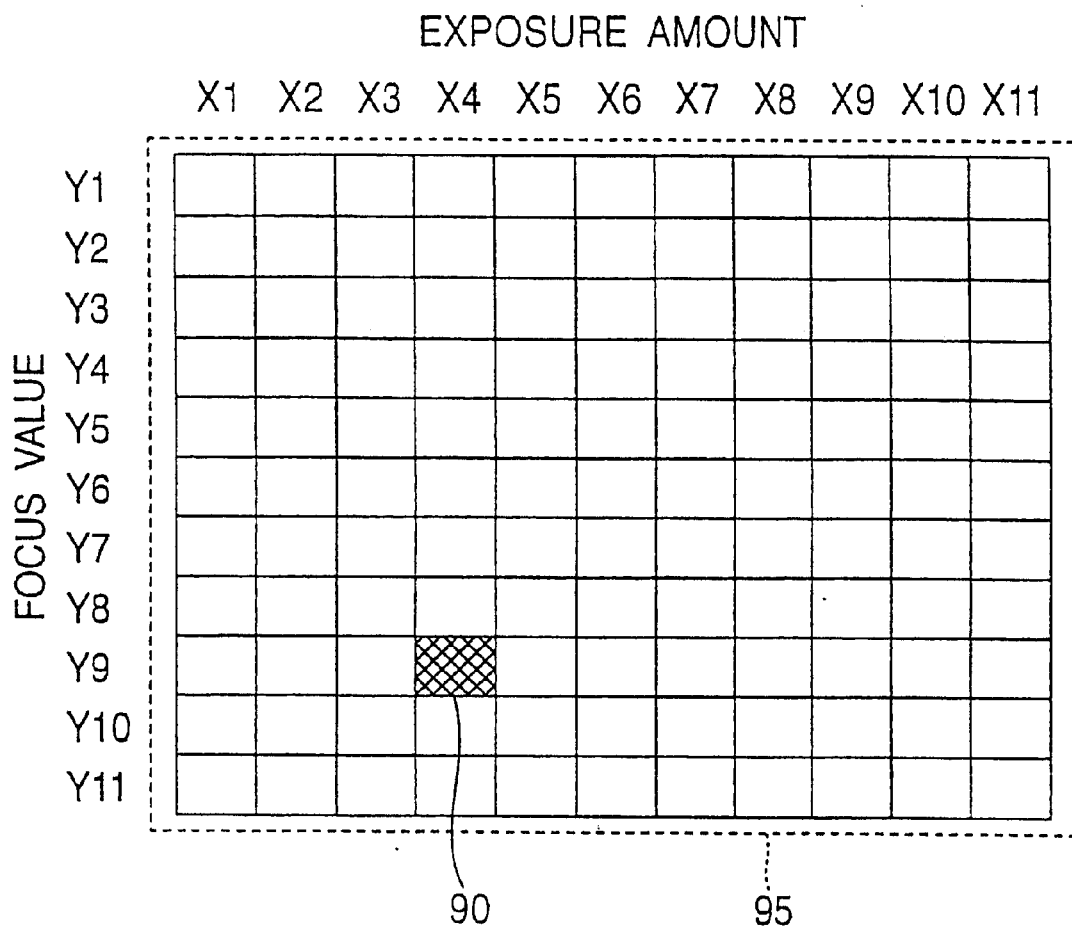
FIG. 2 shows a lattice matrix and a segment, in which the focus value is changed in the column direction and the exposure amount is changed in the row direction.

Then, a test exposure is performed by using the wafer having the resist film formed thereon for determining the optimum exposure conditions (step 2). The test exposure is performed by successively exposing a plurality of different positions of the wafer at different exposure amounts and focus values to light at a predetermined pattern formed on a mask (reticle) by using a exposure apparatus (stepper). For example, a lattice matrix 95 consisting of 11 columns and 11 rows is set as shown in FIG. 2, and a test pattern 60 shown in FIG. 3 is transferred onto each segment 90 of the lattice matrix 95 at different focus values (Y1 to Y11) in the column direction and different exposure amounts (X1 to X11) in the row direction.

Figure 3:
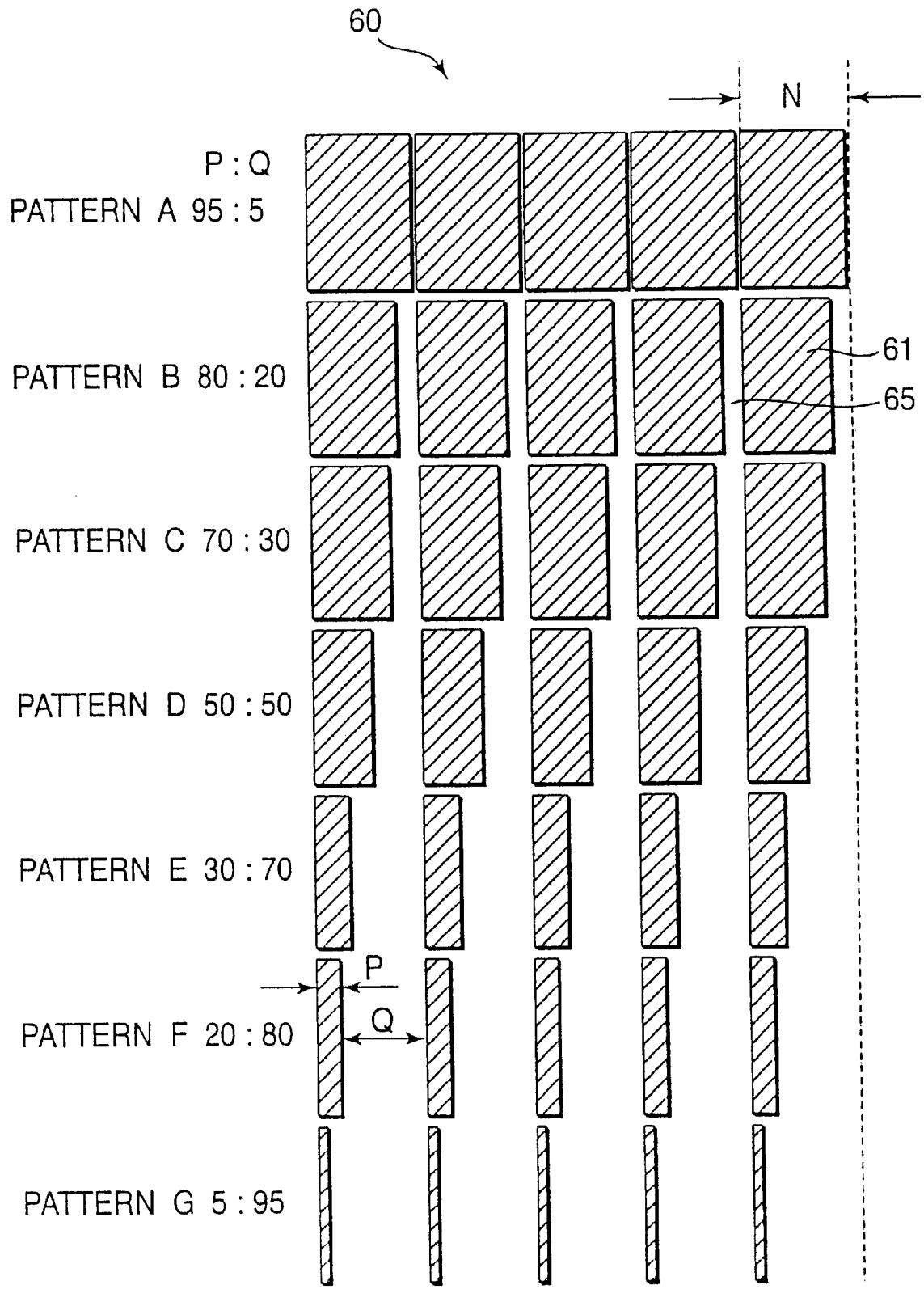
FIG. 3 is a plan view showing a test pattern on a mask used for the exposure according to one embodiment of the present invention.

The test pattern shown in FIG. 3 has sub-patterns A to G. Each of these patterns A to G consists of a linear shielding portion 61 and a linear transmitting portion 65. Each pattern has a fixed width N, and the ratio of the width P of the shielding portion 61 to the width Q of the transmitting portion 65, the sum of P and Q being 100, is set to fall within a range of between 95:5 and 5:95, as shown in FIG. 3. The ratio P:Q is changed in seven stages within the range of between 95:5 and 5:95.

For example, the fixed width N of the pattern can be set at 0.5 $\mu$m. The ratio of the width P of the shielding portion to the width of the transmitting portion Q is not limited to the values shown in FIG. 3 and can be set optionally in a plurality of stages. It is possible to determine the conditions of the exposure more accurately and precisely by forming more sub-patterns by increasing the number of dividing stages of the width N of the pattern.

The test pattern used in the test exposure for step 2 is not limited to the linear patterns shown in FIG. 3. In the test pattern 60 shown in FIG. 3, the linear transmitting portion 65 is formed in only the vertical direction as apparent from patterns A to G. Alternatively, it is possible to use a columnar pattern 60a as shown in FIG. 4A. In this case, square shielding portions 61a are formed in the state of a matrix and a transmitting portion 65a is formed between the shielding portions 61a in each pattern Aa to Ga. It is also possible to use a hole-like pattern 60b shown in FIG. 4B. In this case, a transmitting portion 65b of a predetermined shape is arranged at a predetermined position within a shielding portion 61b, and patterns Ab to Gb are made different from each other in the area occupied by the transmitting portion 65b.

In the next step, the wafer subjected to the test exposure by using the test pattern 60 is subjected to a developing treatment (step 3). For performing the developing treatment, a wafer is attached to, for example, a spin chuck by means of vacuum suction. Under this condition, a developing solution is supplied onto the wafer, and the developing solution is centrifugally removed from the wafer a predetermined time later by rotating the wafer, followed by washing away the residual developing solution on the wafer with a rinsing solution.

The wafer after the developing treatment is dried and, then, the shape of the developed pattern is observed with, for example, a scanning electron microscope (SEM) or a length measuring SEM so as to determine the optimum exposure conditions (step 4). In this SEM observation, the exposure conditions which permit the developed pattern to be formed with a high precision are looked for so as to permit a wide range of resolution (discrimination) between the exposed portion exposed to the light transmitted through the transmitting portion 65 formed in the patterns A to G and the non-exposed portion in which the exposing light is shielded by the shielding portion 61 and to permit the shape of the developed pattern to be close to the shape of the test pattern 60.

It should be noted that the developed pattern actually formed on the wafer is not always coincident with the pattern 60 formed in the mask. This will now be described in detail, covering the case where a positive resist is used as the resist.

Figure 5A:
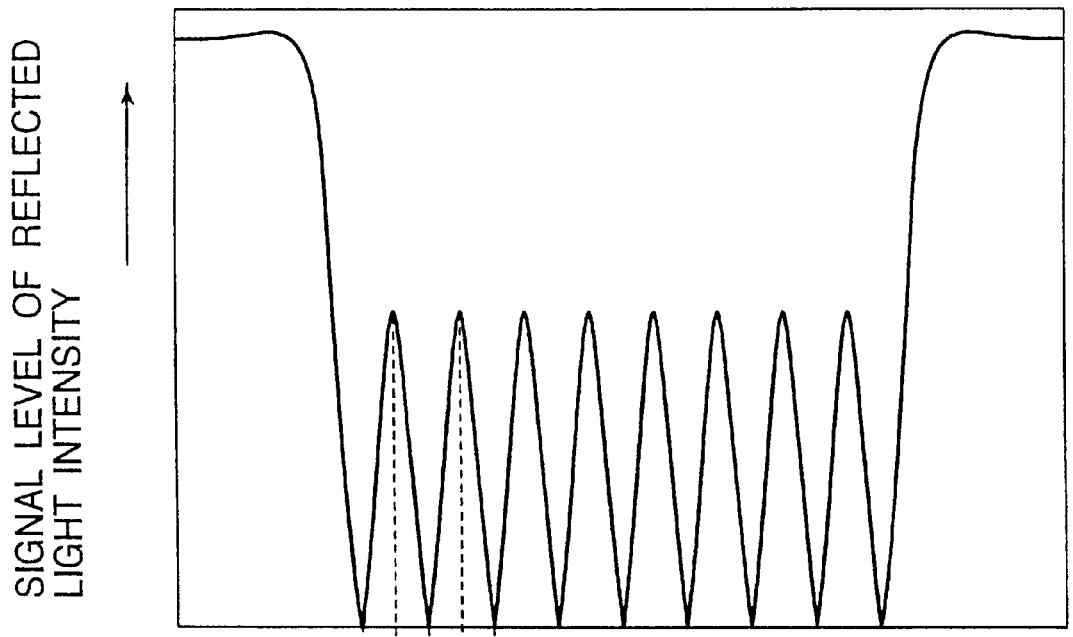
FIG. 5A is a graph showing the relationship between the distance of the width direction of a test pattern and the signal level of reflected light intensity.
Figure 5B:
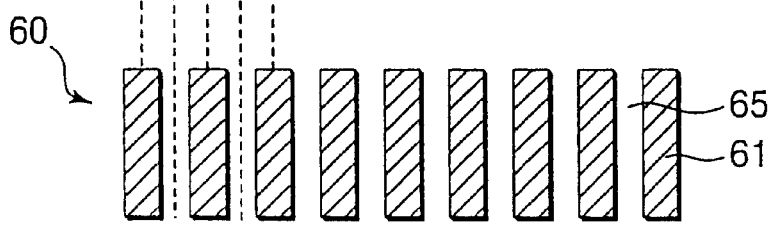
FIG. 5B is a plan view showing the test pattern corresponding to FIG. 5A.
Figure 5C:
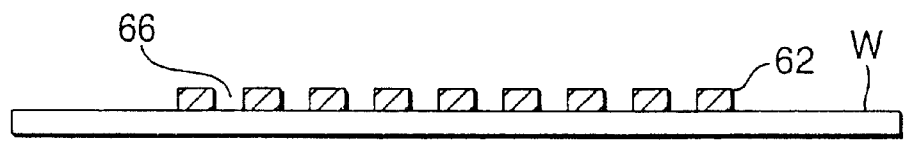
FIG. 5C is a vertical sectional view of the developed pattern corresponding to the test pattern of FIG.5B.
Figure 6:
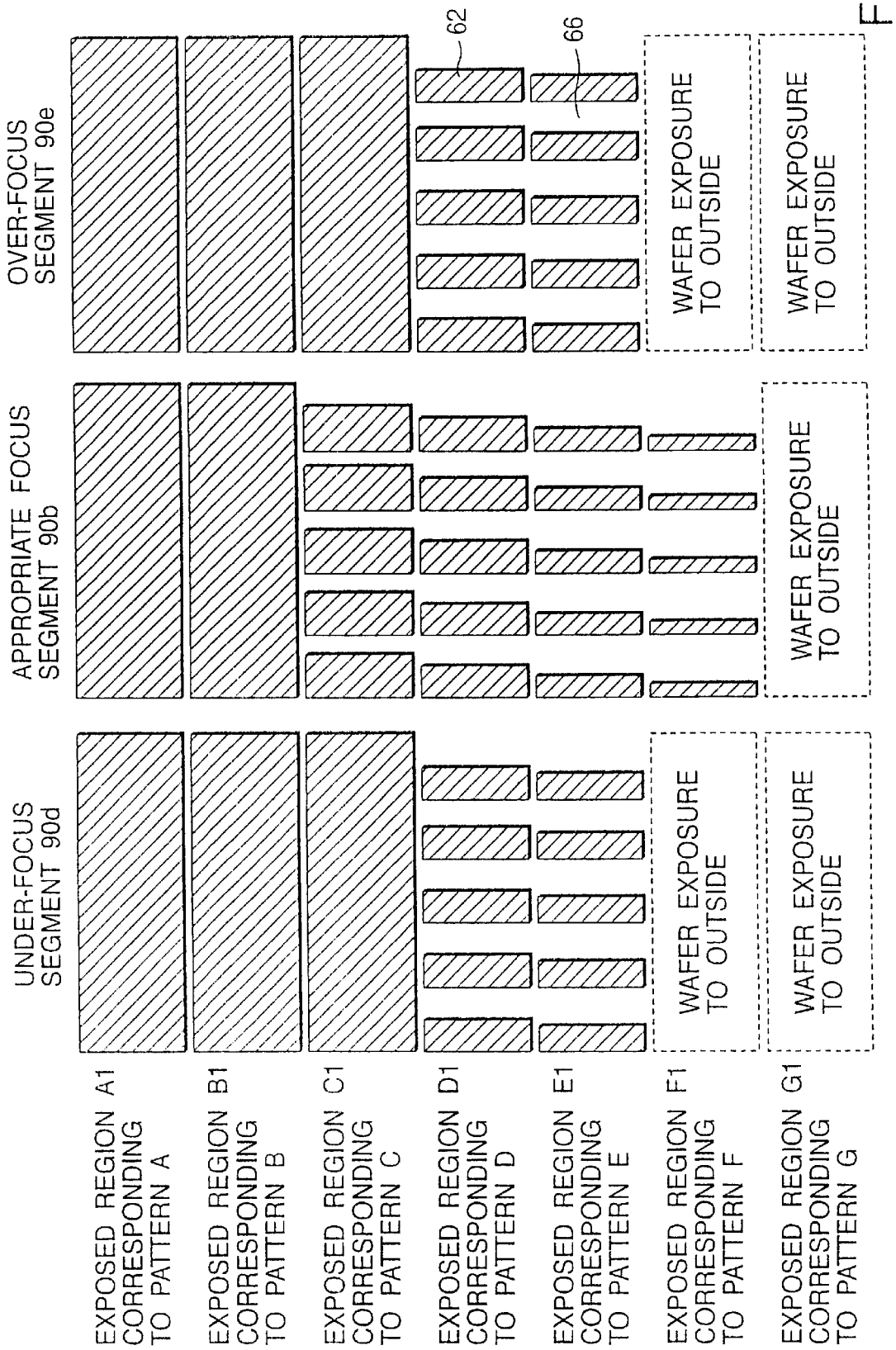
FIG. 6 shows the developed pattern obtained by changing the focus value when the exposure amount is appropriate.
Figure 7:
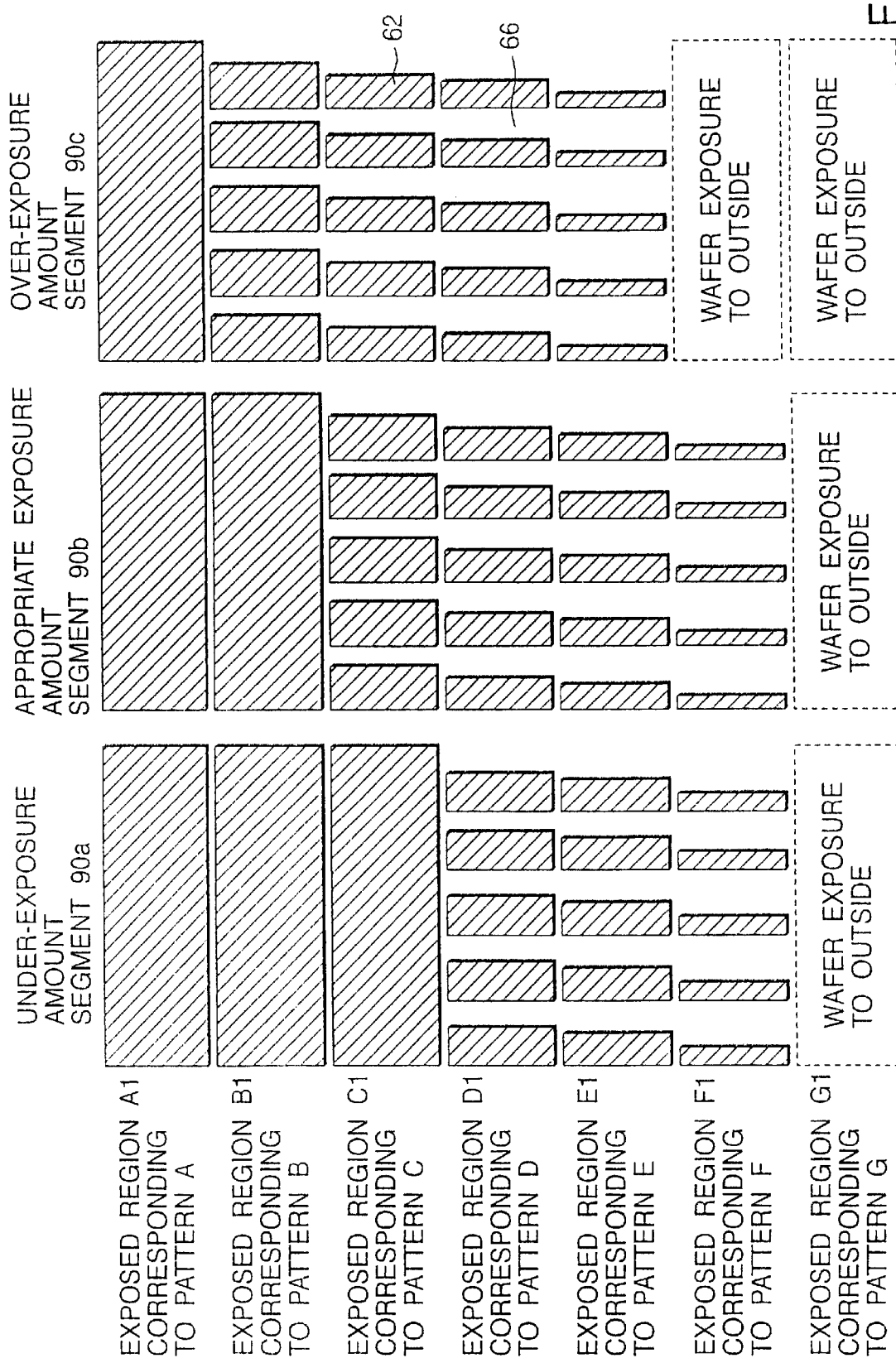
FIG. 7 shows the developed pattern obtained by changing the exposure amount when the focus value is appropriate.

FIG. 5A is a graph showing the relationship between the distance of the width direction of the test pattern and the signal level of reflected light intensity. FIG. 5B is a plan view showing the test pattern 60 corresponding to FIG. 5A. FIG. 5C is a vertical sectional view of the developed pattern corresponding to the test pattern 60 of FIG. 5B. FIG. 6 shows how the developed pattern is changed by the change in the focus value, covering the case where the exposure amount is appropriate. Further, FIG. 7 shows how the developed pattern is changed by the change in the exposure amount, covering the case where the focus value is appropriate.

In the case of using a positive resist, the portion irradiated with the exposing light is dissolved in the developing step, with the result that the surface of the wafer W is exposed to the outside in the irradiated portion so as to form a concave portion 66, as shown in FIGS. 5A, 5B, 5C. On the other hand, the resist remains unremoved in the portion that was not irradiated with the exposing light so as to form a convex portion 62. It follows that, where a certain pattern within the test pattern 60 is transferred as it is, the shielding portion 61 coincides with the convex portion 62, with the transmitting portion 65 coinciding with the concave portion 66.

However, the developed pattern exactly equal to each of the patterns A to G is not necessarily formed in all the exposure regions A1 to G1 corresponding to the patterns A to G depending on, for example, the wavelength of the exposing light and the actual width (length) of the pattern formed in the mask, even if the focus value and the exposure amount are appropriate.

To be more specific, the actual width of the transmitting portion 65 is small in each of patterns A and B and, thus, the exposing light is incapable of passing through the mask. As a result, the concave portion 66 is not formed in any of the exposure regions A1 and B1, with the result that the convex portion 62 consisting of the resist film is formed over the entire region, even if the focus value and the exposure amount are appropriate, as apparent from segment 90b shown in each of FIGS. 6 and 7. Also, the concave portion 66 is not formed in any of the exposure regions A1 and B1 corresponding to the patterns A and B in the case where the resist is not sensitized to such an extent as to be dissolved by the developing treatment because the amount of the light passing through the transmitting portion 65 is small.

On the other hand, when it comes to the pattern G having the transmitting portion 65 of a large width, the amount of light passing through the mask is excessively large, with the result that the resist is sensitized over the entire exposure region G1 corresponding to the pattern G. It follows that the entire surface of the wafer is exposed to the outside (the convex portion 62 is not formed at all). It should also be noted that the light passing through the transmitting portion 65 is diffused, with the result that the entire surface of the wafer is exposed to the outside over the entire exposure region G1 by the pattern G.

In the case of actually using the test pattern 60 in this fashion, the exposed region in which the resolution between the exposed portion and the non-exposed portion was possible results in, for example, the exposed regions C1 to F1 corresponding to the patterns C to F, even if both the focus value and the exposure amount are appropriate.

Segments 90d and 90e shown in FIG. 6 show the developed patterns in the cases of an under-focus value and an over-focus value, respectively. Each of these cases shows the state that, since the focus value is not appropriate, though the exposure amount is appropriate, the shape accuracy in transferring the patterns A to G is lowered. To be more specific, the segments 90d and 90e show the state that the concave portion 66 is not formed not only in the exposed regions A1, B1 but also in the exposed region C1 and, on the other hand, the convex portion 62 ceases to be formed in the exposure region F1. As a result, the resolution is rendered possible in only the exposed portions D1 and E1. In other words, the range in which the resolution can be achieved is rendered narrower than that in the case of the segment 90b in which the exposure is performed under appropriate exposure conditions.

On the other hand, where the exposure amount is small (under-exposure), though the focus value is appropriate, the pattern that can be resolved is shifted toward the transmitting portion 65 having a large width, as apparent from segment 90a shown in FIG. 7. For example, the resolution can be made possible in the exposed regions D1 to F1 corresponding to the patterns D to F. On the other hand, where the exposure amount is large (over-exposure), the pattern that can be resolved is shifted toward the transmitting portion 65 having a small actual width as shown in segment 90c, with the result that the resolution can be achieved in, for example, the exposed regions B1 to E1 corresponding to the patterns B to E.

As described above, where the focus value is set appropriately, the range in which the resolution can be achieved is shifted toward the region in which the transmitting portion 65 has a small width or toward the region in which the transmitting portion 65 has a large width. If the exposure amount differs, the actual width of the transmitting portion 65 in the patterns A to G is rendered different from the actual width of the concave portion 66 in the developed pattern.

For example, when it comes to the exposed region D1 corresponding to the pattern D, the width ratio P to Q in the pattern D is P:Q=50:50. Therefore, it is desirable for the convex portion 62 and the concave portion 66 of the same width to be formed in the exposed region D1, as shown in segment 90b.

However, in the case of the under-exposure amount (segment 90a), the width of the concave portion 66 is rendered smaller than the width of the convex portion 62. On the other hand, in the case of the over-exposure amount (segment 90c), the width of the concave portion 66 is rendered larger than the width of the convex portion 62, resulting in failure to obtain a desired developed pattern.

As described above, in the SEM observation in step 4, the optimum exposure conditions are determined in view of the influence given by the combination of the focus value and the exposure amount to the shape of the developed pattern and in view of the size set for the patterns A to G in the test pattern 60. For example, in the case of FIGS. 6 and 7, the focus value and the exposure amount which permit obtaining the state of the segment 90b, in which the convex portion 62 and the concave portion 66 formed in the exposed region D1 corresponding to the pattern D have the same width, are determined as the optimum focus value and the optimum exposure amount, i.e., as the optimum exposure conditions.

In accordance with FIGS. 6 and 7, the optimum exposure conditions by the SEM observation are set to be the exposure conditions that permit obtaining the developed pattern of the segment 90b in the case of using the test pattern 60. Also, a combination of the minimum value and the maximum value of the width ratio Q of the transmitting portion 65 in the patterns C to F forming the exposure regions C1 to F1, in which the resolution of the exposed portion and the non-exposed portion can be made, is defined as a set of optimum width ratio Cb.

Incidentally, the set of the optimum width ratio and a set of width ratio described herein later can be determined by using the width ratio P of the shielding 5 portion 61. In segment 90b, the value 30, which is the value of the width ratio Q of the pattern C, provides the minimum value, and the value 80, which is the value of the width ratio Q of the pattern F, provides the maximum value. Therefore, the set of the optimum width ratio Cb is represented by "Cb(30·80)".

The method of determining the exposure conditions by the SEM observation, which is carried out in step 4, is equal to the conventional method of determining the exposure conditions. It is necessary to employ the particular method in the present invention, too, as a single step included in the preparatory process.

However, in the method of the present invention for determining the exposure conditions, in order to eliminate the necessity of the particular operation in determining, for example, the next exposure conditions, at least the optical information on the developed pattern obtained by the optimum exposure conditions is collected in addition to the SEM observation in the preparatory process so as to standardize the obtained optical information (step 5), and the standardized optical information is correlated with the exposure conditions determined by the SEM observation (step 6).

It is possible to use, for example, the reflected light intensity (reflectance), and the pattern of the interference fringes when the developed pattern is irradiated with light of a predetermined intensity, as the optical information. In this embodiment, the reflected light intensity is used as the optical information. In this case, steps 5 and 6 are the steps for converting the information relating to the state of the developed pattern (mode and shape) obtained by the SEM observation in respect of the exposed regions A1 to G1 of each segment 90 of the lattice matrix 95 shown in FIG. 2 into the standardized value of the reflected light intensity.

The segment 90b shown in FIGS. 6 and 7 showing the optimum exposure conditions by the SEM observation is depicted again in FIG. 8, and the measurement of the reflected light intensity and the standardization of the measured value will now be described with reference to FIG. 8.

In the first step, the entire segment 90 or the exposed regions A1 to G1 corresponding to the patterns A to G is irradiated with light having a predetermined intensity so as to measure the reflected light intensity within the set range S within the exposed regions A1 to G1. The details of the construction of the apparatus for determining the exposure conditions used in this step will be described herein later.

It is apparent from the result of the SEM observation that each of the exposed regions A1 and B1 consists of the convex portion 62 formed of the resist film alone. Therefore, the exposed regions A1 and B1 exhibit substantially the same reflected light intensity. In the exposed region C1, the concave portion 66 is formed so as to expose partly the surface of the wafer to the outside. Also, since the reflectance of the light from the surface of the wafer is higher than the reflectance of the light from the surface of the resist film, the reflected light intensity of the exposed region C1 is higher than the reflected light intensity of the exposed regions A1 and B1.

Further, the exposed area of the wafer is increased from the exposed region D1 toward the exposed region F1 so as to increase the reflected light intensity measured, reaching the highest reflected light intensity in the exposed region G1 in which the resist film is completely dissolved so as to expose completely the surface of the wafer to the outside.

Since the reflected light intensity of the exposed region G1 denotes the reflected light intensity of the wafer, the values of the reflected light intensities of the exposed regions A1 to G1 are standardized with the reflected light intensity of the exposed region G1 used as a reference on the assumption that the reflected light intensity of the exposed region G1 denotes an invariable value. For example, as shown in FIG. 8, the standardization of the measured reflected light intensity is carried out with the reflected light intensity of the exposed region G1 set at 100 so as to obtain the standardized values (standardized intensity) of 20, 20, 55, 60, 65, 70 and 100 for the exposed regions A1 to G1.

Figure 9:
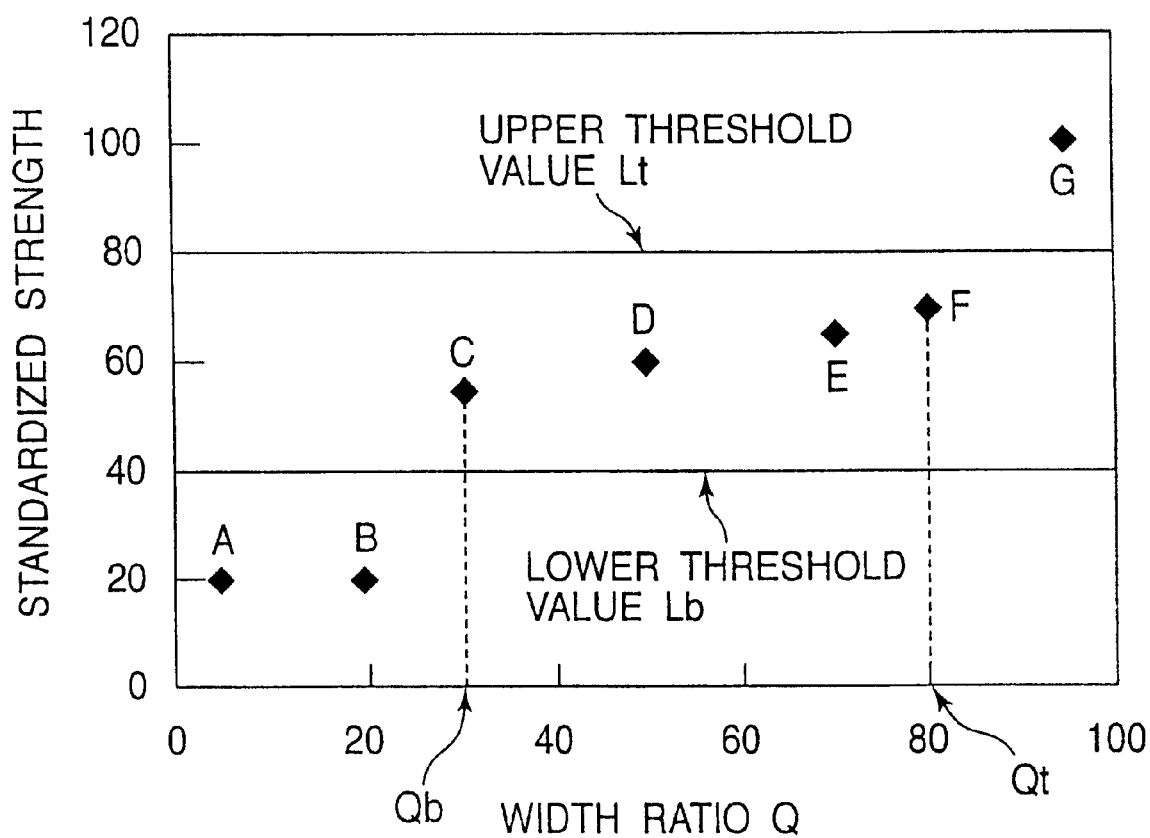
FIG. 9 shows how the value of the standardized intensity is correlated to the width ratios of the transmitting portions of patterns A to G in the test pattern.

Then, the values of the standardized intensities thus obtained are correlated with the width ratio Q of the transmitting portion 65 in the patterns A to G. FIG. 9 shows the modes of the correlation. For performing the correlation, the lower threshold value (Lb) and the upper threshold value (Lt) of the standardized intensity shown in FIG. 9 are set by using as the index for the determination the boundary between the exposed region consisting of the convex portion 62 alone and the exposed region in which the convex portion 62 and the concave portion 66 are present together and the boundary between the exposed region in which the convex portion 62 and the concave portion 66 are present together and the exposed region consisting of the concave portion 66 alone.

In the pattern forming the exposed portion having the standardized intensity interposed between the lower threshold value (Lb) and the upper threshold value (Lt), the smallest value of the width ratio Q of the transmitting portion 65 is used as the lower width ratio (Qb), and the largest value is used as the upper width ratio (Qt). Further, the combination of the lower width ratio (Qb) and the upper width ratio (Qt) is used as a set of width ratio C, and the set of width ratio C is represented as C(Qb·Qt). These values are used in the main process of determining the exposure conditions.

In order to prevent the contradiction with the result of the SEM observation in respect of the segment 90, the lower threshold value (Lb) is determined to fall within a range of between the standardized intensities of the exposed regions B1 and C1, and the upper threshold value (Lt) is determined to fall within a range of between the standardized intensities of the exposed regions F1 and G1.

For example, the lower threshold value (Lb) can be set at 40, which is intermediate between the lower limit 20 and the upper limit 55. In the case of the segment 90b, the width ratio Q (=30) of the pattern C forming the exposed region C1, which has the standardized intensity not lower than 40 and exhibited the smallest standardized intensity of 55, forms the lower width ratio (Qb=30).

It is possible to set the upper threshold value (Lt) to fall within a range of between 70 and 100. If the upper threshold value (Lt) is set at, for example, 80, the width ratio Q (=80) of the pattern F forming the exposed region F1, which has the standardized intensity not higher than 80 and exhibited the largest standardized intensity of 70, forms the upper limit width ratio (Qt=80).

Naturally, the set of width ratio C (Qb·Qt), which is the combination of the lower width ratio (Qb) and the upper width ratio (Qt) obtained in respect of the segment 90, coincides with the set of the optimum width ratio Cb (30·80) determined by the SEM observation described previously.

It is possible for the smallest value of the standardized intensity, i.e., the value 20 of the standardized intensity corresponding to the exposed regions A1 and B1, to be changed by the slight change in, for example, the thickness of the formed resist film. Therefore, a careful attention is required in setting the lower threshold value Lb so as to prevent the judgment that the pattern for forming the exposed region in which the surface of the wafer is actually not exposed at all to the outside is included in the region in which it is possible to resolve the concave portion 66 and the convex portion 62 in the subsequent main process owing to the set threshold value (Lb) being small.

The lower threshold value (Lb), the upper threshold value (Lt), and the set of the optimum width ratio Cb (lower width ratio (Qb)·upper width ratio (Qt)) are determined in the steps 1 to 6 described above. These values provide the references of judgment of the data analysis in the subsequent determination of the exposure conditions (step 7). It is possible to use the optimum exposure conditions (focus value and the exposure amount) determined by the SEM observation) as the initial conditions for starting the measurement of the reflected light intensity in the case where the time for determining the exposure conditions is shortened.

In the next step, the reflected light intensities of the exposed regions A1 to G1 corresponding to the patterns A to G are measured and standardized in respect of each segment 90 of the lattice matrix 95 shown in FIG. 2 referred to previously, i.e., in respect of all the exposure conditions, so as to obtain the lower width ratio Qb relative to the lower threshold value Lb (=40) determined previously and the upper width ratio Qt relative to the upper threshold value Lt (=80), thereby preparing data represented in the form a matrix as in FIG. 2 (step 8).

It is desirable to carry out the SEM observation in respect of each segment 90 included in the lattice matrix shown in FIG. 2. To be more specific, the operation of step 8 is intended to confirm the correlation between the result of the SEM observation and the method of determining the exposure conditions by the measurement of the reflected light intensity and, thus, is not absolutely necessary in the preparatory process. However, the operation of step 8 is important in the sense of confirming the reliability of the method of the present invention for determining the exposure conditions using the measurement of the reflected light intensity and, thus, the operation of step 8 is carried out.

FIG. 10 shows the data obtained in step 8 in the form of a matrix. It is seen from FIGS. 10A and 10B that, since the lower width ratio (Qb) is 50 and the upper width ratio (Qt) is 70 under the exposure conditions of, for example, the exposure amount X5 and the focus value Y5, the convex portion 62 and the concave portion 66 are present in the exposed regions D1, E1 corresponding to the patterns D and E, that the convex portion 62 alone is present in the exposed portions A1 to AC, and that the concave portion 66 alone is present in the exposed regions F and G. The particular state is equal to the state of the segment 90d or the segment 90e shown previously in FIG. 6.

It is also seen that, since the upper width ratio (Qt) is 70 and the lower width ratio (Qb) is 20 under the exposure conditions of the exposure amount X7 and the focus value Y6, both the convex portion 62 and the concave portion 66 are formed in the exposure regions B1 to E1 corresponding to the patterns B to E, that the convex portion 62 alone is present in the exposed region A1, and that the concave portion 66 alone is present in the exposed regions F1 and G1. This state is equal to the state of the segment 90c shown previously in FIG. 7.

As described above, it is possible to know instantly from FIGS. 10A and 10B the range of the patterns in which the exposed portion and the non-exposed portion can be resolved within the patterns A to G by the SEM observation of the obtained developed patterns in respect of each segment 90. The exposure conditions giving the state of the segment 90b shown in FIG. 6 are the optimum exposure conditions. Therefore, if the exposure conditions in which the lower width ratio (Qb) is 30 and the upper width ratio (Qt) is 80 are searched from FIGS. 10A and 10B, it is seen from the result of the SEM observation that the focus value Y6 and the exposure amount X6 constitute the optimum exposure conditions.

In order to facilitate the search of the optimum exposure conditions from FIGS. 10A and 10B, a matrix is prepared by subtracting the value in FIG. 10A from the value in FIG. 10B in each segment 90, as shown in FIG. 10C. As described previously with reference to FIGS. 5 and 6, the number of patterns in which the exposed portion and the non-exposed portion can be resolved is increased if the focus value is appropriate, making it possible to judge that the exposure conditions in the case where the value shown in FIG. 10C is large are close to the appropriate conditions. In this fashion, it is possible to make narrower the range of the optimum exposure conditions.

For example, since 50 is the largest value in FIG. 10C, it is possible to know easily that the optimum exposure conditions reside within the range in which the focus value is Y6 and the exposure amount is X6 to X8. However, the difference is 50 in each of the cases where the set of the width ratio C is C(30·80) and where the set of the width ratio C is C(20·70).

Under the circumstances, where a plurality of the same maximum values are included in FIG. 10C, the exposure conditions that permit obtaining a set of the optimum width ratio Cb(30·80) are selected from the values of FIGS. 10A and 10B. To be more specific, in the case of FIG. 10C, the set of the width ratio C(Qb·Qt) is coincident with the set of the optimum width ratio Cb(30 ·80) in only the case where the exposure amount is X6. In this fashion, it is possible to determine the optimum exposure conditions.

As apparent from the description given above, steps 1 to 8 are directed to the operation of converting the state of the developed pattern, which is determined by the SEM observation, into the information on the reflected light intensity so as to prepare the standardized data (reference date). The optimum exposure conditions can be searched from the reference data.

Figure 11:
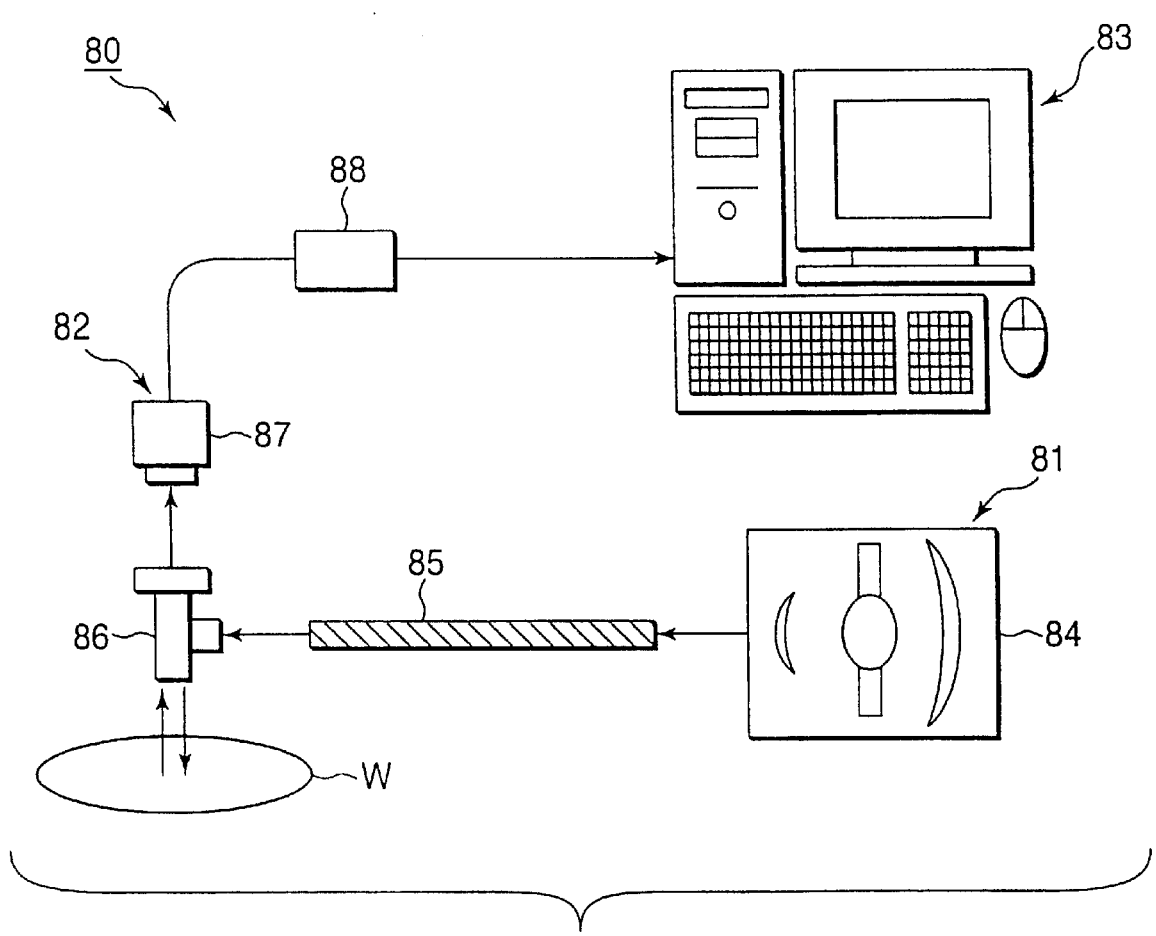
FIG. 11 shows the construction of the apparatus for determining the exposure conditions according to one embodiment of the present invention.

Let us describe the construction of the apparatus for determining the exposure conditions, which is used for preparation of the reference data in the preparatory process referred to previously and in the main process that is to be described herein later. FIG. 11 schematically shows the construction of an apparatus 80 for determining the exposure conditions according to one embodiment of the present invention. The apparatus 80 for determining the exposure conditions include a light irradiating section 81 for irradiating a predetermined range of the developed pattern formed in a wafer W with light having a predetermined intensity, a detecting section 82 for measuring the reflected light intensity within a predetermined range of the wafer W irradiated with the light, and an arithmetic process section 83 for processing the reflected light intensity obtained in the detecting section 82.

The light irradiating section 81 includes a light source device 84 provided with, for example, a light source capable of selectively emitting the light having a narrow band of wavelength, e.g., the light having a wavelength of 400 to 600 nm, emitted from, for example, a halogen lamp, a metal halide lamp, a fluorescent lamp or an incandescent lamp, and a reflector, and an optical fiber 85 for guiding the light emitted from the light source device 84 into the wafer W. The light coming from the optical fiber 85 is collected by a mirror (not shown) and a lens (not shown) arranged in an optical path control section 86, with the result that a predetermined range of the wafer W, e.g., the entire region of a single segment 90, is irradiated with the light emitted from the light source device 84.

In this case, the wafer W is disposed on, for example, an X-Y stage (not shown) and is capable of movement in parallel to the plane so as to permit a predetermined range of the wafer W to be positioned within a range irradiated with the light.

Figure 8:
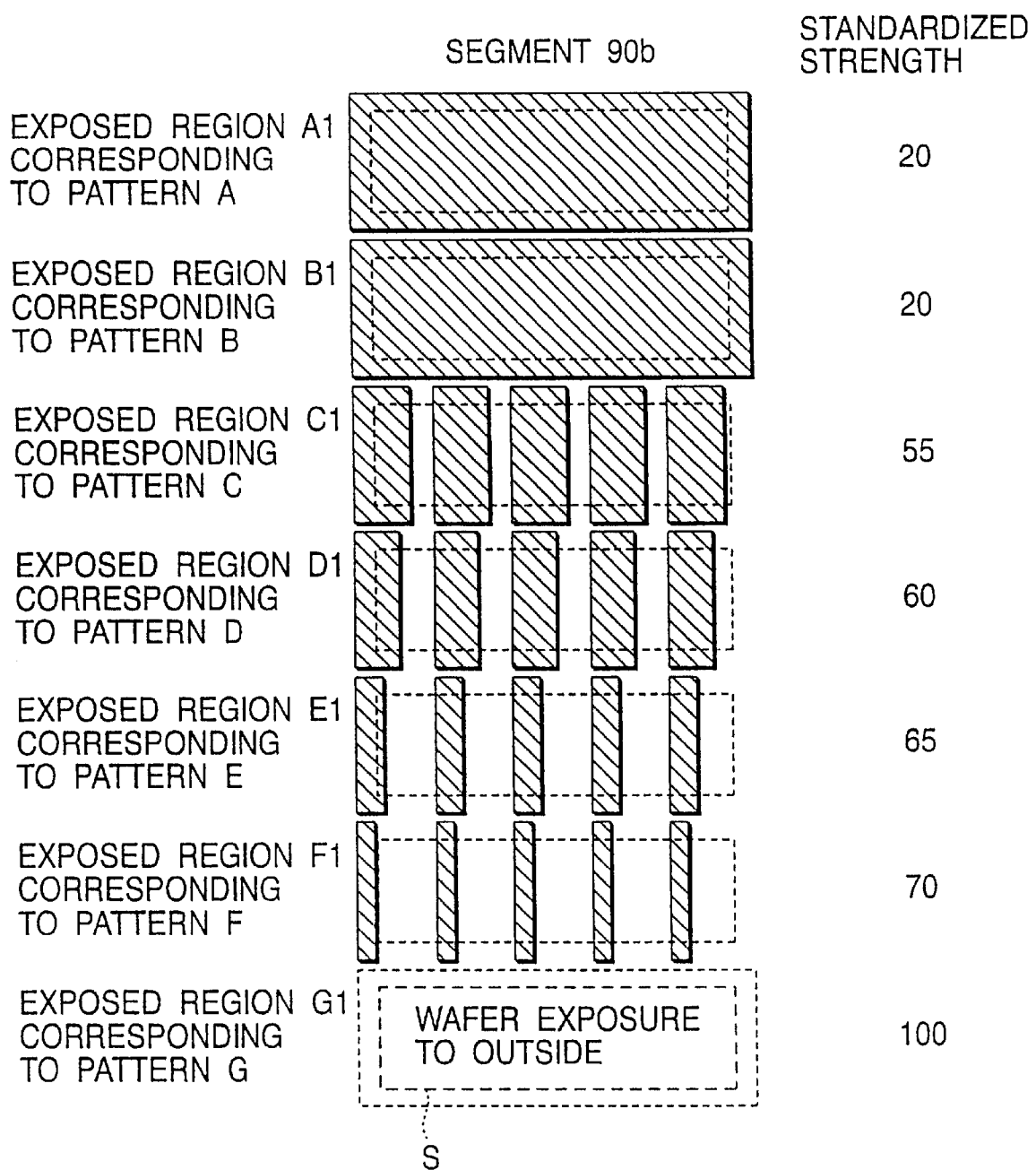
FIG. 8 shows the segment 90*b* shown in FIGS. 6 and 7.

The detecting section includes, for example, a CCD camera or a line sensor 87 as a device for measuring the reflected light intensity within a set range S shown in FIG. 8, which is not shown in FIG. 11, within the predetermined range irradiated with a predetermined light amount. The image signal picked up by the CCD camera or the line sensor 87 is converted into the reflected light intensity by using a signal converting device such as an electric board 88 connected to the CCD camera or the line sensor 87 so as to obtain the reflected light intensity of the set range S.

Incidentally, the line sensor is a camera in which a plurality of CCD elements that are arranged linearly are scanned and is capable of obtaining information similar to that obtained by the CCD camera. Also, as shown in FIG. 5 referred to previously, the signal level of the reflected light intensity is high in the portion of the concave portion 66 in which the surface of the wafer W is exposed to the outside and is low in the portion of the convex portion 62 covered with the resist.

The reflected light intensity thus obtained is subjected to an arithmetic calculation in the arithmetic process section 83 so as to calculate the standardized intensity. A specific example of the arithmetic process section 83 is a personal computer. The movement of the wafer w (driving of the X-Y stage) and the signal reading performed by the electric board 88 can be automatically performed by the signal generated from the arithmetic process section 83.

For example, it is possible to repeat the operation that, after reading of the reflected light intensity of a single segment 90 formed in the wafer W, the wafer is moved by a predetermined distance by the signal generated from the arithmetic process section 83 so as to measure again the reflected light intensity of another exposed region. It is possible for the arithmetic process section 83 to carry out the process of standardizing the reflected light intensity in parallel to the measurement of the reflected light intensity.

By comparing the standardized intensity thus obtained by using the apparatus 80 for determining the exposure conditions with the upper threshold value (Lt) and the lower threshold value (Lb) determined in the preparatory process referred to previously, it is possible to know the state of the set range S giving the standardized intensity, i.e., it is possible to know whether or not the resolution of the exposed portion and the non-exposed portion can be performed. Concerning the wafer W for which the reflected light intensity was measured, it is possible to obtain the information relating to the combination of the lower width ratio (Qb) and the upper width ratio (Qt) shown in FIGS. 10A and 10B.

The main process of the method of the present invention for determining the exposure conditions will now be described. In the main process, used are the apparatus for determining the exposure conditions described above and the reference data determined in the preparatory process. However, the SEM observation is not required in the main process.

As shown in the right column of FIG. 1, a resist film is formed on a test wafer prior to the start-up of the exposure treatment applied to the wafer for forming the product (step 9), followed by applying a exposure treatment to each of a plurality of segments 90 constituting the lattice matrix 95 on the test wafer by using the test pattern 60 at different focus values and exposure amounts, as shown in FIG. 2 (step 10). Then, the test wafer is developed and dried so as to form a developed pattern (step 11).

In the next step, the measurement and standardization of the reflected light intensity are performed for the exposed regions A1 to G1 corresponding to the patterns A to G of the test pattern 60 in each segment 90 by using the apparatus 80 for determining the exposure conditions (step 12). If the obtained value of the standardized intensity is not lower than the lower threshold value (Lb=40) and not higher than the upper threshold value (Lt=80), it is judged that the resolution of the exposed portion and the non-exposed portion was possible. Also, the lower width ratio (Qb) and the upper width ratio (Qt) are obtained from the width ratio Q in the transmitting portion of the pattern forming the exposed portion capable of resolution (step 13).

Incidentally, it is necessary for the resist film formed on the test wafer to be formed by using the same kind of the resist solution in a thickness equal to that of the resist film formed on the wafer in the preparatory process. A plurality of reference data conforming with each of the conditions for the cases where a plurality of different kinds of resist solutions are used and where the formed resist films differ from each other in thickness are prepared in accordance with steps 1 to 8 described previously.

Concerning all the segments 90, it is possible to determine the new optimum exposure conditions by obtaining the lower width ratio (Qb), the upper width ratio (Qt) and the difference therebetween and by detecting the exposure conditions exhibiting a set of optimum width ratio Cb(30·80), which exhibits the optimum exposure conditions obtained in the preparatory process (step 14).

If the reflected light intensity is measured for all the segments 90 in accordance with steps 9 to 14 described above, it is certainly possible to achieve automation. However, it is unavoidable to spend a long time for determining the exposure conditions. Under the circumstances, attentions are paid to the characteristics of the exposure apparatus that the conditions of the exposure apparatus are not changed extremely, though these conditions are changed with time. Therefore, in the step 12, the reflected light intensity is measured in respect of only the segment 90 including the developed pattern formed by the exposure conditions close to the optimum exposure conditions determined previously in the preparatory process. It is generally possible to detect the optimum exposure conditions by this method, too, so as to shorten the time required for determining the exposure conditions.

The steps 9 to 14 were performed under 15 exposure conditions in the vicinity of the focus value Y6 and the exposure amount X6 so as to obtain the lower width ratio (Qb), the upper width ratio (Qt) and the difference therebetween. FIGS. 12A to 12C show the results.

The reflected light intensity is automatically measured and standardized for the segment 90 corresponding to 15 exposure conditions, and the obtained values of the standardized intensity are compared with the upper threshold value (Lt) and with the lower threshold value (Lb) so as to determine the upper width ratio (Qt) and the lower width ratio (Qb) of the pattern giving the exposure region within a range in which the resolution between the exposed portion and the non-exposed portion is possible. Since a set of the optimum width ratio Cb giving the optimum exposure conditions is Cb(30·80), it is seen from FIGS. 12A to 12C that the focus value Y5 and the exposure amount X7 meeting the particular condition collectively constitute the optimum exposure conditions.

In addition to the method of mapping the upper width ratio (Qt) and the lower width ratio (Qb) in respect of a plurality of segments 90 as described above, it is also possible to employ the method of searching the optimum exposure conditions starting with a certain exposure condition.

For example, the optimum exposure amount and the optimum focus value determined in the preparatory process are used as the initial conditions for making narrower the range of the exposure region in which the reflected light intensity is measured in the operation to determine the exposure conditions for the main process. It is possible to employ the method of determining the optimum exposure conditions by determining provisional conditions replacing the initial conditions every time the reflected light intensity is measured, and the provisional conditions are regarded as the optimum exposure conditions unless the provisional conditions are changed.

In the particular method, any one of the optimum exposure amount and the optimum focus value of the initial conditions, e.g., the optimum exposure amount is fixed as the provisional exposure amount, the reflected light intensity of the exposed region at a predetermined range of the focus value is measured so as to determine a set of width ratio C' (Qt·Qb) close to the optimum width ratio Cb (30·80) from the reflected light intensity thus obtained.

In the next step, the focus value in the exposure condition giving the determined set of width ratio C' (Qt·Qb) is fixed as the provisional focus value, and the reflected light intensity is measured in a plurality of exposed regions of different exposure amount so as to determine a set of the width ratio C'' (Qt·Qb) close to the optimum width ratio Cb (30·80).

Where the optimum width ratio Cb (30·80) is given in the case where the conditions of the set of the width ratio C' (Qt·Qb) and the set of the width ratio C'' (Qt·Qb) are the same, the exposure conditions giving the set of the width ratio C' (Qt·Qb) provide the optimum exposure conditions.

Also, where the set of the width ratio C' (Qt·Qb) and the set of the width ratio C'' (Qt·Qb) differ from each other in the conditions, it is possible to make narrower the range of the optimum exposure conditions by repeating the method of renewing the exposure amount of the exposure condition giving the set of the width ratio C'' (Qt·Qb), obtaining the set of the width ratio C' (Qt·Qb) from the initial conditions, and further obtaining the width ratio C'' (Qt·Qb).

FIGS. 13A to 13C show the result of mapping the lower width ratio (Qb), the upper width ratio (Qt) and the difference therebetween, which are finally obtained by this method.

Since the optimum exposure conditions obtained in the preparatory process were the focus value Y6 and the exposure amount X6, the measurement of the reflected light intensity, the calculation of the standardized intensity, the upper width ratio (Qt) and the lower width ratio (Qb) are determined by, for example, fixing the focus value at focus value Y6 first and changing the exposure amount within a range of between X4 and X8.

If the conditions having a set of the optimum width ratio Cb(30·80) are obtained within the calculated range of the standardized strength, the operation to determine the exposure conditions is finished at this stage. However, if the set of the optimum width ratio Cb is not found, then, the upper width ratio (Qt) and the lower width ratio (Qb) are determined by changing the focus value in respect of the exposure amount giving a large difference between the upper width ratio (Qt) and the lower width ratio (Qb).

In the FIGS. 13A and 13B, the cases of the exposure amount X6 and the exposure amount X7 correspond to the case where the set of the optimum width ratio Cb is not found. In the case of, for example, the exposure amount X6, which is the optimum exposure amount in the preparatory stage, the upper width ratio (Qt) and the lower width ratio (Qb) are obtained by changing the focus value within a range of between Y4 and Y7.

However, since the exposure conditions in which the difference between the upper width ratio (Qt) and the lower width ratio (Qb) is 50 were not found in the case of the exposure amount Y6, then, the upper width ratio (Qt) and the lower width ratio (Qb) are obtained again within a range of between the exposure amount X4 and the exposure amount X8 in respect of, for example, the focus value Y5 in which the difference between the upper width ratio (Qt) and the lower width ratio (Qb) has the second largest value in the case of the exposure amount X6.

It should be noted that, in the case of the focus value Y5, the difference between the upper width ratio (Qt) and the lower width ratio (Qb) is 50 under the two conditions of the exposure amounts X7 and X8. Among these two conditions, a set of the width ratio C(Qt·Qb) under the exposure conditions of the focus value Y5 and the exposure amount X7 coincides with the optimum width ratio Cb(30·80). It follows that the focus value Y5 and the exposure amount X7 provide the optimum exposure conditions.

Incidentally, it is possible to confirm that the focus value Y5 and the exposure amount X7 provide the optimum exposure conditions by, for example, obtaining the standardized strength in the case where the exposure conditions are set close to the focus value Y5 and the exposure amount X7, which are the optimum exposure conditions, e.g., where the focus value is set at Y4 and the exposure amount is set at X7 and X8, so as to obtain the upper width ratio (Qt) and the lower width ratio (Qb).

It is desirable to confirm whether the values of the standardized strength of the exposed regions A1 to G1 corresponding to the patterns A to G formed under the optimum exposure conditions determined by the various methods described above are close to the values of the standardized strength obtained under the optimum exposure conditions determined in the preparatory process. For example, since the standardized strength of the exposed regions C1 to F1 falls within a range of between 55 and 70 in respect of the segment 90b obtained in the preparatory process, it is possible to improve the accuracy of the operation to determine the exposure conditions by confirming whether the standardized strength of the exposed regions C1 to F1 in the segment formed at the focus value Y5 and the exposure amount X7, which are the optimum exposure conditions obtained in the main process described above, falls with the range of between 55 and 70.

It should also be noted that, even where the standardized strength of the exposed regions C1 to F1 in the segment formed at the focus value Y5 and the exposure amount X7 obtained in the main process falls within the range of between 55 and 70, it is possible for the actual sizes of the convex portion 62 and the concave portion 66 formed in the exposed regions C1 to F1 to be deviated from the actual sizes of the shielding portion 61 and the transmitting portion 65 of the patterns C to F in the case where the standardized strength noted above falls within a very small range, e.g., falls within a range of between 60 and 65 or between 65 and 70.

In order to detect the particular situation, it is desirable to construct the apparatus 80 for determining the exposure conditions such that a restriction that the standardized strength of the exposure region corresponding to the pattern giving the lower width ratio (Qb) should not be smaller than 50, more severely, should fall within a range of between 50 and 60 is provided according to the preparatory process and that, where this condition is not satisfied, an alarm is generated.

It is also desirable to construct the apparatus 80 for determining the exposure conditions such that a limitation that the standardized strength of the exposed region corresponding to the pattern giving the upper width ratio (Qt) should be not larger than 75, more severely should fall within a range of between 65 and 75, is provided and, if this condition is not satisfied, an alarm is generated, because, in this case, it is possible to improve the accuracy of the operation to determine the exposure conditions.

Where the formation of the resist film, the exposure treatment of the resist film, the developing treatment of the exposed wafer, and the apparatus 80 for determining the exposure conditions are operated normally, it is possible to obtain the exposure conditions equal to the optimum exposure conditions determined in the preparatory process by the method for determining exposure conditions in the main process described above. However, it is considered possible for the developed pattern having the shape equal to the developed pattern under the optimum exposure conditions determined in the preparatory process not to be detected in, for example, a plurality of segments differing from each other in the exposure conditions and formed in the test wafer for determining the exposure conditions.

Various disorders in the exposure apparatus such as the defective adjustment of the light source and the optical system of the exposure apparatus and the damage done to the mask are considered to be the causes of the situation described above. On the other hand, since the failure or disorder of the light source apparatus 84, the CCD camera or the line sensor 87 of the apparatus 80 for determining the exposure conditions is also considered to be the cause of the situation described above, it is possible to inspect the exposure apparatus used and the apparatus for determining the exposure conditions based on the result of the method of the present invention for determining the exposure conditions so as to maintain a good state of use of these apparatuses. It is possible to take measures such as the alarm generation in also the case where such a situation is generated.

The apparatus of the present invention for determining the exposure conditions, which can be used independently as a single apparatus, can also be incorporated in, for example, an exposure apparatus. It is also possible to arrange the apparatus for determining the exposure conditions within a resist coating-developing process system such that the wafer after the developing treatment is transferred into the apparatus for determining the exposure conditions so as to automatically determine the exposure conditions.

Figure 14:
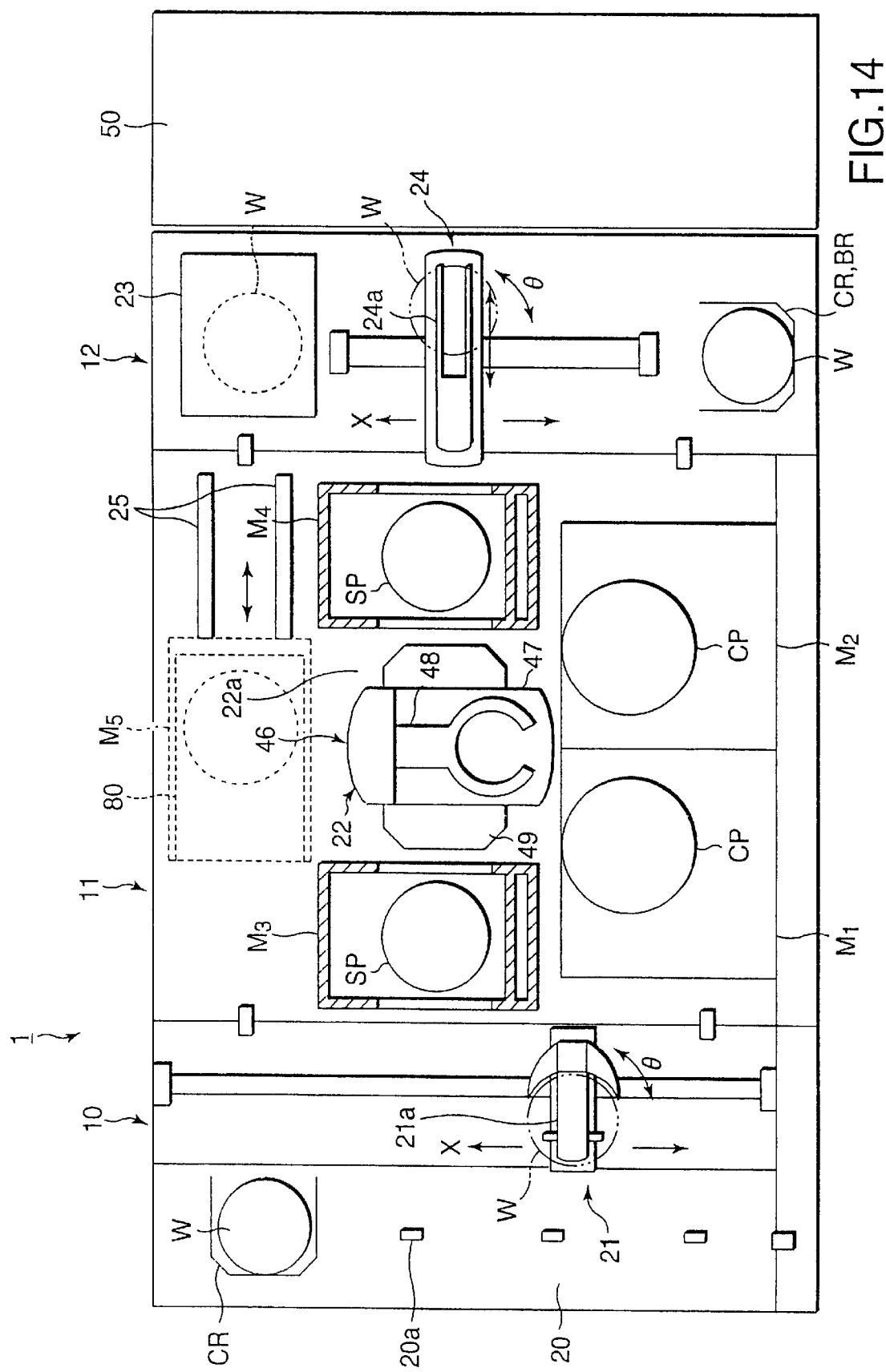
FIG. 14 is a plan view showing the resist coating-developing process system equipped with the apparatus for determining the exposure conditions according to one embodiment of the present invention.
Figure 15:
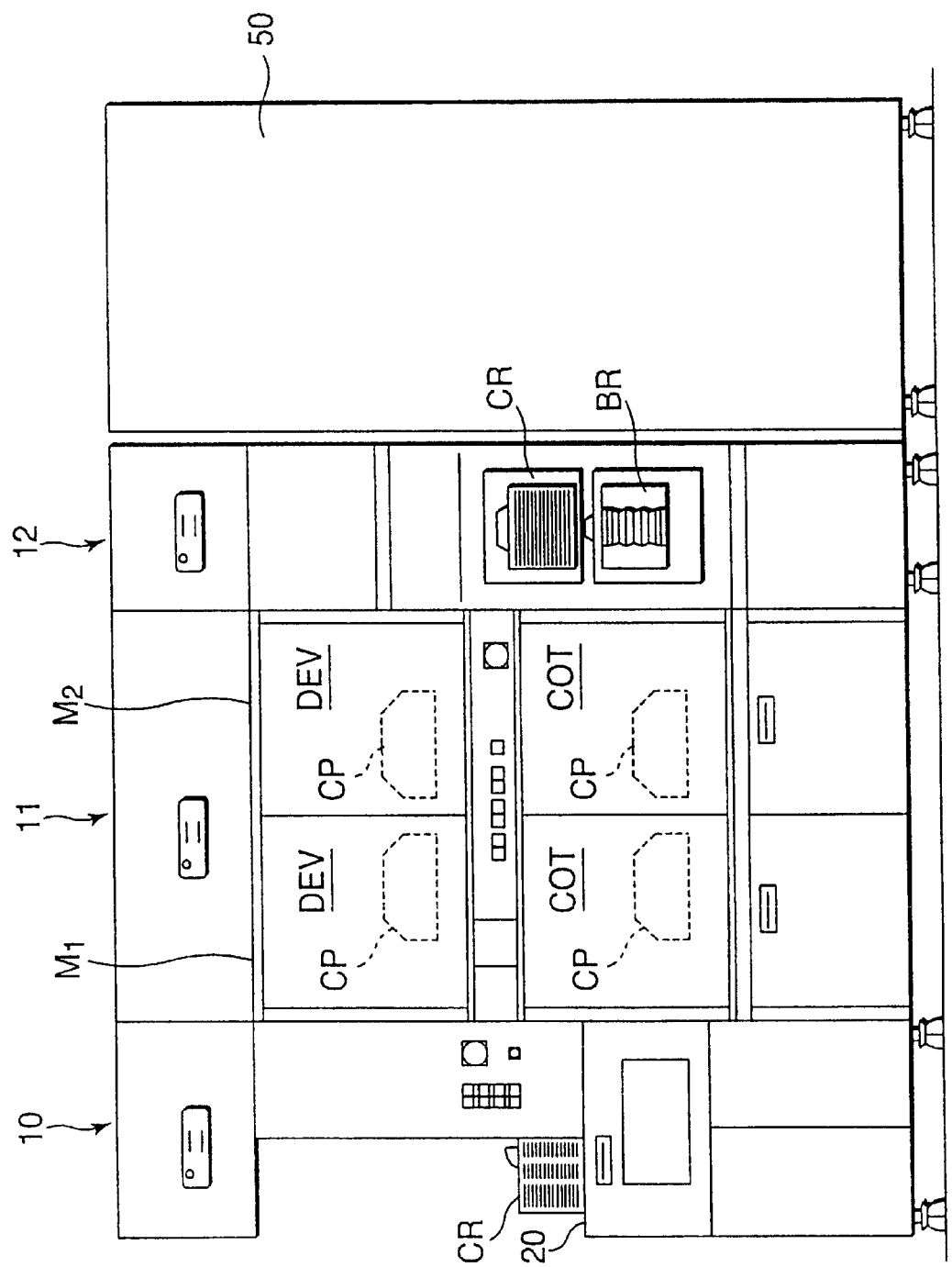
FIG. 15 is a side view showing the resist coating-developing process system shown in FIG. 14.

For example, FIG. 14 is a plan view schematically showing the resist coating-developing process system 1 equipped with the apparatus 80 for determining the exposure conditions, and FIG. 15 is a side view of the resist coating-developing process system. The resist coating-developing process system 1 comprises a cassette station 10 constituting a transfer station, a process station 11 equipped with a plurality of process units, and an interface section 12 arranged contiguous to the process station 11 for the delivery of the wafer W to and from a exposure apparatus 50.

A wafer cassette CR having a plurality of wafers W to be treated, e.g., 24 wafers W, housed therein is arranged on the cassette station 10, and the cassette station serves to transfer the wafer W between the wafer cassette CR and the process station 11. To be more specific, the cassette station 10 serves to transfer the wafer cassette CR having the wafers W housed therein from another system into the resist coating-developing process system 1 or from the resist coating-developing process system 1 into another system.

As shown in FIG. 14, a plurality of position-determining projections 20a, i.e., four projections 20a in the drawing, are arranged on a table 20 in the cassette station 10. These projections 20a are arranged to form a row in the X-direction in the drawing. It is possible to dispose the wafer cassettes CR in the positions of the projections 20a to form a row such that the wafer delivery port of each of these wafer cassettes CR faces the process station 11. The wafers W are arranged in the wafer cassette CR apart from each other in the vertical direction (Z-direction). The cassette station 10 also comprises a wafer transfer mechanism 21 interposed between the table 20 and the process station 11.

The wafer transfer mechanism 21 includes a wafer transfer arm 21a capable of movement in the direction of the wafer cassette arrangement (X-direction) and in the direction of the wafer arrangement within the wafer cassette CR (Z-direction). The wafer transfer mechanism 21 itself is also movable in the X-direction, with the result that the wafer transfer arm 21a is capable of gaining access selectively to any of the wafer cassettes CR arranged on the table 20. Also, the wafer transfer arm 21a is swingable in the θ-direction as shown in FIG. 14, with the result that the wafer transfer arm 21a is capable of gaining access to the alignment unit (ALIM), which is described herein later, and the extension unit (EXT), which is described herein later, both belonging to a third process section M3 on the side of the process station 11.

On the other hand, a plurality of process units for applying a series of process steps to the wafer W when the coating and developing treatments are applied to the wafer W are arranged in the process station 11. These process units are arranged in predetermined positions to form a multi-stage structure as a whole, and the wafer W is processed one by one by these process units. As shown in FIG. 14, a wafer transfer path 22a is formed in the central portion of the process station 11, and a main wafer transfer mechanism 22 is arranged in the wafer transfer path 22a. Also, all the process units are arranged to surround the wafer transfer path 22a. Each of these process units is divided into a plurality of process sections. Also, each of these process sections includes a plurality of process units stacked in the vertical direction (Z-direction) to form a multi-stage structure as a whole.

The main wafer transfer mechanism 22 includes a wafer transfer device 46 arranged movable in the vertical direction (Z-direction) inside a cylindrical support member 49. The cylindrical support member 49 can be rotated by a rotary driving force of a motor (not shown), and the wafer transfer device 46 is rotated together with rotation of the cylindrical support member 49. The transfer device 46 includes a plurality of holding members 48 movable in the front-rear direction of a transfer table 47. The wafer delivery between the adjacent process units is achieved by these holding members 48.

As shown in FIG. 14, four process sections M1, M2, M3 and M4 are arranged in this embodiment to surround the wafer transfer path 22a. The first and second process sections M1 and M2 are arranged in parallel on the front side of the resist coating-developing process system 1. On the other hand, the third process section M3 is arranged contiguous to the cassette station 10, and the fourth process section M4 is arranged contiguous to the interface section 12.

In the resist coating-developing process system 1, the four process sections M1, M2, M3 and M4 are arranged to surround the wafer transfer path 22a. In addition, it is possible to arrange a fifth process section M5 in the rear portion of the system 1. It should be noted that the apparatus 80 for determining the exposure conditions is mounted to the position of the fifth process section M5. As a result, delivery of the wafer W after the developing treatment can be achieved between an X-Y table (not shown) on which the wafer W is disposed in the apparatus 80 for determining the exposure conditions and any of the process sections by using the holding member 48.

The fifth process section M5 can be moved sideward along a guide rail 25 as viewed from the main transfer mechanism 22. It follows that, even where the fifth process section M5 is arranged and the apparatus 80 for determining the exposure conditions is arranged in the position of the fifth process section M5 behind the main wafer transfer mechanism 22, it is possible to ensure a free space behind the main wafer transfer mechanism 22 by sliding the apparatus 80 along the guide rail 25 and, thus, the maintenance operation can be applied easily to the main wafer transfer mechanism 22 from behind the mechanism 22.

The first process section M1 includes a resist coating unit (COT) consisting of two spinner type process units in which a predetermined treatment is applied to the wafer W, which is held on a spin chuck (not shown), within a coater cup (CP), and a developing unit (DEV) for developing the resist pattern, said developing unit (DEV) being stacked on the coating unit (COT). The second process section M2 also includes a resist coating unit (COT) consisting of two spinner type process units and a developing unit (DEV) stacked on the coating unit (COT).

In the third process section M3, it is possible to arrange a plurality of oven type process units, in each of which a predetermined treatment is applied to the wafer W disposed on a table SP, one upon the other in the vertical direction to form a multi-stage structure as a whole. For example, it is possible to arrange a cooling unit (COL) for performing a cooling treatment, an adhesion unit (AD) for performing a so-called "dehumidifying treatment" for enhancing the fixing properties of the resist, an alignment unit (ALIM) for performing the position alignment, an extension unit (EXT) for performing the delivery of the wafer W, and a hot plate unit (HP) for applying a heating treatment to the wafer W both before and after the exposure treatment and after the developing treatment one upon the other in the order mentioned.

The fourth process section M4 also includes a plurality of oven type process units that are stacked one upon the other.

For example, it is possible to arrange a cooling unit (COL), an extension-cooling unit (EXTCOL) constituting a wafer delivery section equipped with a cooling plate, an extension unit (EXT), a cooling unit (COL), and a hot plate unit (HP) one upon the other in the order mentioned.

The interface section 12 is equal to the process station 11 in the length in the X-direction. As shown in FIGS. 14 and 15, a movable pick up cassette CR and a stationary buffer cassette BR are stacked one upon the other in the front portion of the interface section 12. A peripheral exposure device 23 is arranged in the rear portion of the interface section 12. Further, a wafer transfer mechanism 24 is arranged in the central portion of the interface section 12. The wafer transfer mechanism 24 includes a wafer transfer arm 24a, which is movable in the X-direction and the Z-direction and, thus, is capable of gaining access to the cassettes CR, BR and the peripheral exposure device 23.

Also, the wafer transfer arm 24a is swingable in the θ-direction and, thus, is also capable of gaining access to the extension unit (EXT) arranged in the fourth process section M4 of the process station 11 and to the wafer delivery table (not shown) of the adjacent exposure apparatus 50. The arranging position of the apparatus 80 for determining the exposure conditions is not limited to the position of the fifth process section M5. It is also possible to arrange the apparatus 80 within, for example, the exposure apparatus 50 or adjacent to the exposure apparatus 50. Further, the apparatus 80 can be arranged anywhere within the resist coating-developing process system 1 as far as the wafer W can be transferred by the various wafer transfer mechanisms.

In the process for determining the exposure conditions using the resist coating-developing process system 1 described above, the wafer transfer arm 21a of the wafer transfer mechanism 21 gains access to the wafer cassette CR disposed on the table 20 and housing unprocessed wafers W in the cassette station 10 so as to take out a single wafer W (test wafer) and transfers the wafer W thus taken out to the extension unit (EXT) arranged in the third process section M3.

The wafer W is transferred by the wafer transfer device 46 of the main wafer transfer mechanism 22 from the extension unit (EXT) into the process station 11. Then, after aligned by the alignment unit (ALIM) arranged in the third process section M3, the wafer W is transferred into the adhesion process unit (AD) so as to be subjected to the dehumidifying treatment (HMDS treatment) for enhancing the fixing properties of the resist. Since the dehumidifying treatment involves heating, the wafer W is then transferred by the wafer transfer device 46 into the cooling unit (COL) for the cooling.

Depending on the kind of the resist used, the wafer W is transferred directly into the resist coating unit (COT) without applying the HMDS treatment. For example, in the case of using a polyimide series resist, the wafer W is transferred directly into the resist coating unit (COT).

The wafer W cooled in the cooling unit (COL) after completion of the treatment within the adhesion process unit (AD), or the wafer W that was not subjected to the treatment within the adhesion process unit (AD), is transferred by the wafer transfer device 46 into the resist coating unit (COT) so as to be coated with resist and, thus, to form a coated film. After completion of the coating treatment, the wafer W is subjected to a pre-baking treatment within the hot plate unit (HP) arranged in any of the third process section M3 and the fourth process section M4 and, then, cooled in any one of the cooling units (COL).

The cooled wafer W is transferred into the alignment unit (ALIM) arranged in the third process section M3 so as to be aligned and, then, transferred into the interface section 12 via the extension unit (EXT) arranged in the fourth process section M4.

In the interface section 12, the wafer W is subjected to a peripheral exposure by the peripheral exposure device 23 so as to remove the excess resist and, then, a test exposure treatment is applied to the resist film formed on the wafer W by the exposure apparatus 50 arranged adjacent to the interface section 12 by using the test pattern 60 described previously so as to determine the optimum exposure conditions.

The wafer W after the exposure treatment is brought back to the interface section 12 and transferred by the wafer transfer mechanism 24 into the extension unit (EXT) arranged in the fourth process section M4. Further, the wafer W is transferred by the wafer transfer device 46 into the hot plate unit (HP) so as to be subjected to the post-exposure baking treatment and, then, cooled in the cooling unit (COL).

Then, the wafer W is transferred into the developing unit (DEV) for the development of the exposed pattern. After completion of the developing treatment, the wafer W is transferred into any one of the hot plate units (HP) for the post-baking treatment, followed by the cooling treatment in the cooling unit (COL). After completion of the series of the processing, the wafer W is transferred into the apparatus 80 for determining the exposure conditions arranged in the fifth process section M5 so as to determine the optimum exposure conditions based on the measurement of the reflected light intensity, and the result of the determination is fed back to the exposure apparatus 50 so as to set again the operating conditions of the exposure apparatus 50 and, thus, to start up the processing of the wafer W forming the product.

Incidentally, the test wafer is brought back to the cassette station 10 via the extension unit (EXT) arranged in the third process section M3 so as to be housed in any of the wafer cassettes CR.

In the case of using the resist coating-developing process system 1 of the construction described above, it is possible to correct appropriately the exposure conditions and to perform diagnosis of the disorder of the resist coating-developing process system 1 by transferring appropriately the test wafer into the resist coating-developing process system 1 during processing of the product.

Also, in the case of employing the method of determining the exposure conditions described above, it is possible to obtain, for example, a standardized intensity by measuring and standardizing the reflected light intensity in respect of the developed pattern formed in a good shape within a predetermined range of the developed pattern formed in the wafer W forming the product. The standardized intensity thus obtained is used as a reference value, and the reflected light intensity is measured for the predetermined range of the wafers W that are processed successively. It is possible to carry out the processing while confirming the formed state of the developed pattern for all the wafers W by comparing the result of the measurement of the reflected light intensity with the reference value determined in advance. In the case of employing the particular method of determining the exposure conditions, it is possible to manage the quality of the product more sufficiently so as to improve the reliability.

The present invention is not limited to the embodiment described above. For example, in the test pattern 60 used for determining the exposure conditions, the width ratio P·Q of the shielding portion 61 to the transmitting portion 65 was changed in 7 stages of the patterns A to G. However, it is possible to improve the precision of the operation to determine the exposure conditions by forming the patterns in a larger number of stages.

In the test pattern 60, the shielding portion 61 and the transmitting portion 65 for each of the patterns A to G are formed in a fixed width N of 0.5 μm. However, the foxed width N is not limited to the value given above. Further, it is also possible to define more finely the modes of the developed pattern of the exposed regions obtained under certain exposure conditions by forming in parallel two kinds of patterns differing from each other in, for example, the fixed width N and having the same width ratio P·Q of the shielding portion 61 to the transmitting portion 65.

Figure 4B:
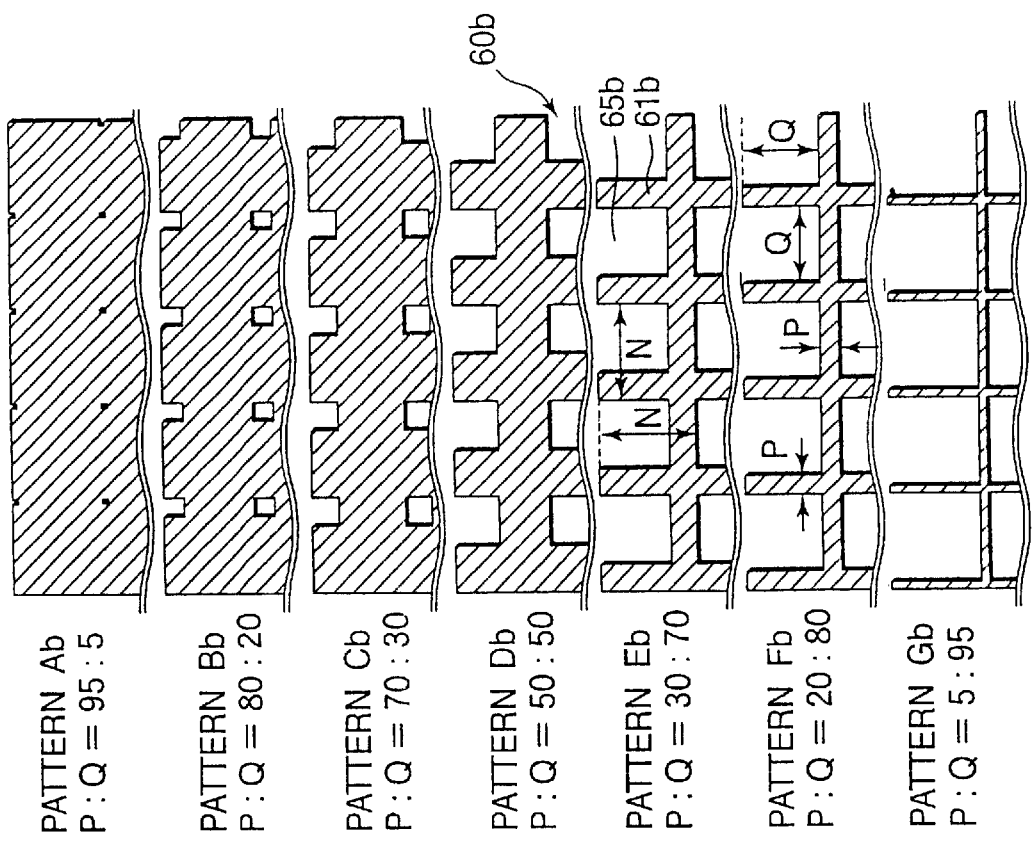
FIGS. 4A and 4B are plan views each showing the test pattern on the mask used for the exposure according to another embodiment of the present invention.
Figure 4A:
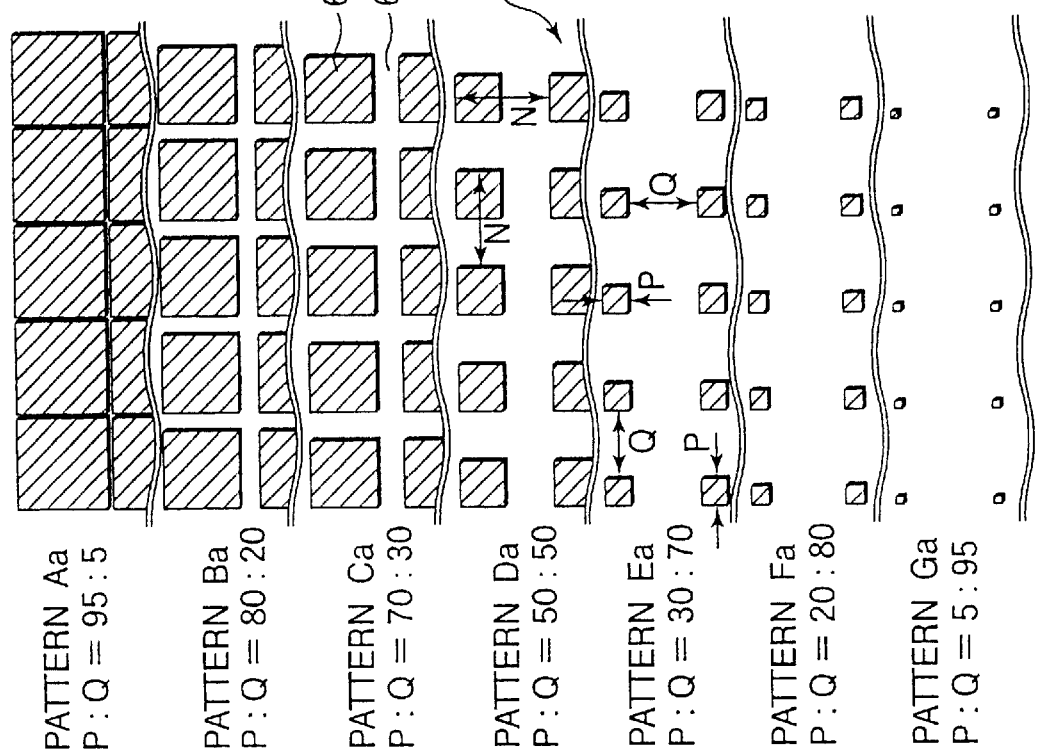

Also, it is possible to use the columnar test pattern 60a or the square hole test pattern 60b shown in FIG. 4A or FIG. 4B, respectively, in place of the linear test pattern 60 shown in FIG. 3. Further, a linear boundary is formed between the shielding portion 61 and the transmitting portion 65 in each of the test patterns 60, 60a and 60b. However, it is possible for a curved boundary to be formed in place of the linear boundary between the shielding portion 61 and the transmitting portion 65. For example, the square transmitting portion 65b shown in FIG. 4B can be replaced by, for example, a circular transmitting portion.

It is desirable for the apparatus 80 for determining the exposure conditions to be equipped with a plurality of light sources. For example, it is possible to use a light source comprising a plurality of narrow band wavelength light sources differing from each other in the wavelength. In this case, it is possible to obtain information on the reflected light intensity reflecting with a higher fidelity the shape of the developed pattern formed on the wafer by selecting a suitable single narrow band wavelength light source from among the plural narrow band wavelength light sources. For example, where the transmitting portion formed in the test pattern has a small width, light having a short wavelength is used so as to allow the light to pass through the transmitting portion.

In the case of employing the apparatus for determining the exposure conditions equipped with a light source comprising a plurality of narrow band width wavelength light sources, it is possible to obtain a merit that the measurement of the reflected light intensity relative to a multi-layered film can be performed more accurately.

It is possible to use the apparatus 80 for determining the exposure conditions for feeding back the determined exposure conditions to the exposure apparatus 50 so as to change the exposure conditions in the exposure apparatus 50 into the optimum conditions. In addition, it is possible to use the apparatus 80 for changing the process conditions in the resist coating unit (COT) and the developing unit (DEV).

Figure 16:
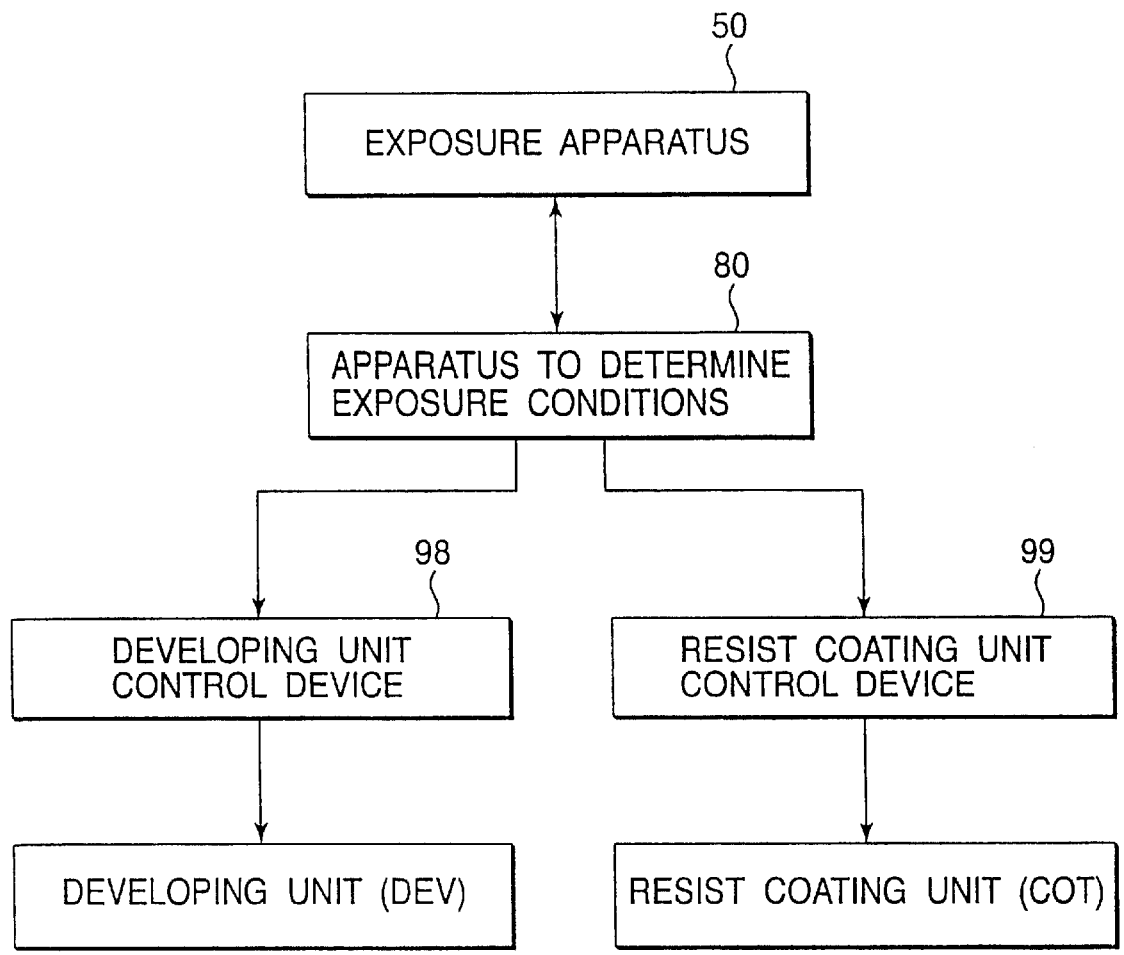
FIG. 16 shows how the resist coating-developing process system is controlled by the apparatus of the present invention for determining the exposure conditions.

FIG. 16 shows the construction of the system for changing the process conditions of the resist coating unit (COT) and the developing unit (DEV) by using the apparatus 80 for determining the exposure conditions. For example, in order to permit the developed pattern obtained when the exposure conditions in the exposure apparatus 50 are fixed to be equal to the developed pattern obtained under the optimum exposure conditions even if the exposure conditions are not changed, the apparatus 80 for determining the exposure conditions supplies an instruction to a developing unit control device 98 to change, for example, the temperature of the developing solution and the developing treating time. Upon receipt of the instruction, the developing unit control device 98 changes, for example, the developing treating time.

Also, the apparatus 80 for determining the exposure conditions supplies an instruction to a resist coating unit control device 99 to change, for example, the rotating speed of the wafer to permit the resist solution to be spread over the entire wafer or to change the temperature of the resist solution. Upon receipt of the instruction, the resist coating unit control device 99 changes, for example, the rotating speed of the wafer. In this fashion, a satisfactory developed pattern is formed on the wafer.

The embodiment described above is directed to the operation to determine the exposure conditions using a semiconductor wafer as a target object to be processed. However, the present invention can also be utilized effectively for the operation to determine the exposure conditions for a LCD substrate.

The embodiment described above is simply intended to clarify the technical idea of the present invention. The technical scope of the present invention should not be construed based solely on the embodiment described above. In other words, the present invention can be worked in variously modified fashions based on the spirit of the present invention and within the range of the present invention defined in the claims.

What is claimed is:

1. An apparatus for determining the exposure conditions, which determines optimum exposure conditions for a test substrate, based on a plurality of developed patterns obtained by exposing a plurality of different positions of said test substrate to light with a mask having a predetermined pattern at different exposure amounts and focus values and performing development thereon, said apparatus comprising:

a light irradiating section, which irradiates a predetermined range of said developed patterns of said test substrate with light having a predetermined intensity;

a light-measuring section, which measures reflected light intensity on a predetermined region within said predetermined range; and an arithmetic process section, which searches for optimum exposure conditions for said test substrate, based on reflected light intensity measured by said light-measuring section, wherein said arithmetic process section comprises a database having data obtained in advance and including combination data of exposure amounts and focus values respectively for a plurality of different positions of a preliminary substrate other than said test substrate, wherein said combination data consist of different exposure amounts and focus values used to expose said positions of said preliminary substrate to light with said mask; shape data by SEM observation on a plurality of developed patterns obtained by developed said preliminary substrate; and reflected light intensity data obtained by irradiating said developing patterns on said preliminary substrate with light having said predetermined intensity, wherein said combination data, said shape data, and said reflected light intensity data are mutually correlated to provide optimum exposure conditions for said preliminary substrate from said combination data based on said shape data, and an arithmetic unit, which compares reflected light intensity measured on said developed patterns on said test substrate with said reflected light intensity data in said database to search for optimum exposure conditions for said test substrate.

2. The apparatus for determining the exposure conditions according to claim 1, wherein said light-measuring section includes a CCD camera or a line sensor and signal converting means for converting a image signal of said predetermined region picked up by said CCD camera or line sensor into reflected light intensity.

3. The apparatus for determining exposure conditions according to claim 1, wherein said light irradiating section includes a narrow band wavelength light source and an optical fiber for transmitting light coming from said narrow band width wavelength light source toward said test substrate.

4. The apparatus for determining exposure conditions according to claim 1, wherein said light irradiating section includes a light source having a plurality of narrow band wavelength light sources differing from each other in wavelength and an optical fiber for transmitting light coming from said light source toward said test substrate, and a suitable narrow band wavelength light source is selected for use from said narrow band wavelength light sources in accordance with the predetermined pattern of said mask.

5. The apparatus for determining exposure conditions according to claim 1, wherein the predetermined pattern of said mask is a pattern in which a ratio of a line width to a space width is changed and the sum of said line width and said space width is set constant.

6. A method of determining exposure conditions in a photolithography step, said method comprising the steps of:
exposing a plurality of different positions of a test substrate to light with a mask having a predetermined pattern at different exposure amounts and focus values;
irradiating a plurality of developed patterns, formed by developing said test substrate, with light having a predetermined intensity, and measuring reflected light intensity thereon; and
determining optimum exposure conditions for said test substrate from combinations of said exposure amounts and said focus values, based on reflected light intensity measured on said developed patterns,
wherein said step of determining optimum exposure conditions is performed by comparing reflected light intensity measured on said developed patterns on said test substrate with a database having data obtained in advance and including combination data of exposure amounts and focus values respectively for a plurality of different positions of a preliminary substrate other than said test substrate, wherein said combination data consists of different exposure amounts and focus values used to expose said positions of said preliminary substrate to light with said mask; shape data by SEM observation on a plurality of developed patterns obtained by developing said preliminary substrate; and reflected light intensity data obtained by irradiating said developed patterns on said preliminary substrate with light having said predetermined intensity, wherein said combination data, said shape data, and said reflected light intensity data are mutually correlated to provide optimum exposure conditions for said preliminary substrate from said combination data based on said shape data.

7. The method of determining exposure conditions according to claim 6, wherein a narrow band wavelength light source is used as a light source of the light, with which said developed patterns are irradiated.

8. A method of determining exposure conditions in photolithography steps, said method comprising the steps of:
constructing a database, which includes a plurality of different exposure conditions formed of combinations of exposure amounts and focus values; shape data by SEM observation on a plurality of developed patterns on a preliminary substrate, wherein said developed patterns on said preliminary substrate are formed by exposing a plurality of different positions of said preliminary substrate to light under said exposure conditions and performing development thereon; and reflected light intensity data obtained by irradiating said developed patterns with light having a predetermined intensity, wherein said exposure conditions, said shape data, and said reflected light intensity data are mutually correlated; and determining optimum exposure conditions for a test substrate in each of photolithography steps performed after construction of said database, by exposing said test substrate to light under said exposure conditions and performing development thereon, thereby forming a plurality of developed patterns on said test substrate, and comparing reflected light intensity on said developed patterns with said reflected light intensity data in said database, wherein said step of constructing a database comprises sub-steps of exposing a plurality of different positions of said preliminary substrate to light with a mask having a predetermined pattern at different exposure amounts and focus values, forming said developed patterns on said preliminary substrate by developing said preliminary substrate, irradiating a predetermined range of said developed patterns on said preliminary substrate with light having a predetermined intensity, thereby obtaining said reflected light intensity data, performing SEM observation on said developed patterns on said preliminary substrate, thereby obtaining said shape data, and mutually correlating combination data of said exposure amounts and said focus values, said shape data, and said reflected light intensity data, and said step of determine optimum exposure conditions for a test substrate comprises sub-steps of exposing a plurality of different positions of said test substrate to light with said mask at different exposure amounts and focus values, forming said developed patterns on said test substrate by developing said test substrate, irradiating a predetermined range of said developed patterns on said test substrate with light having said predetermined intensity, and measuring reflected light intensity thereon, and comparing said reflected light intensity on said developed patterns on said test substrate with said reflected light intensity data in said database.

9. The method of determining exposure conditions according to claim 8, wherein a narrow band wavelength light source is used as a light source of the light.

10. The method of determining exposure conditions according to claim 8, wherein a plurality of narrow band wavelength light sources differing from each other in wavelength are used as a light source of light, with which said developed patterns are irradiated, and a suitable narrow band wavelength light source is selected for use from said narrow band wavelength light sources in accordance with the predetermined pattern of said mask.

11. The method for determining exposure conditions according to claim 8, wherein the predetermined pattern of said mask comprises a plurality of regions having linear, columnar, or hole-like transmitting portions and shielding portions between said transmitting portions, and differing from each other in width ratio between widths of a transmitting portion and a shielding portion, said sub-step of performing SEM observation on said preliminary substrate comprises specifying resolvable regions in which resolution is achievable between a portion corresponding to said transmitting portion and a portion corresponding to said shielding portion, in each of said developed patterns on said preliminary substrate; and comprises obtaining a set of transmitting portion percentages, which is a combination of an upper limit and a lower limit of percentages of said transmitting portion in said width ratio, in said plurality of regions of the predetermined pattern of said mask corresponding to said resolvable regions, said sub-step of measuring reflected light intensity on said preliminary substrate comprises obtaining an upper limit and a lower limit of reflected light intensity on unsolvable regions in which resolution by SEM observation is not achievable between a portion corresponding to said transmitting portion and a portion corresponding to said shielding portion, in each of said developed patterns on said preliminary substrate, and said sub-step of mutually correlating the data on said preliminary substrate comprises combining said set of transmitting portion percentages of said resolvable regions with said upper and lower limits of reflected light intensity on said resolvable regions.

12. The method of determining exposure conditions according to claim 11, wherein width ratios of said shielding portions are used in place of width ratios of said transmitting portions as said set of transmitting portion percentages.

13. The method for determining exposure conditions according to claim 11, wherein said sub-step of performing SEM observation on said preliminary substrate comprises obtaining optimum exposure conditions from said exposure conditions, based on said shape data by SEM observation, said sub-step of measuring reflected light intensity on said preliminary substrate comprises measuring reflected light intensity on said resolvable regions and said unsolvable regions of a developed pattern corresponding to said optimum exposure conditions, said sub-step of mutually correlating the data on said preliminary substrate comprises obtaining a set of transmitting portion percentages presenting said optimum exposure conditions, from reflected light intensity corresponding to said optimum exposure conditions, said sub-step of measuring reflected light intensity on said test substrate comprises measuring reflected light intensity on said resolvable regions and said unsolvable regions in a plurality of developed patterns, which correspond to said optimum exposure conditions determined in said step of constructing a database and a plurality of exposure conditions close to said optimum exposure conditions, and said sub-step of comparing said reflected light intensity on said test substrate comprises obtaining said set of transmitting portion percentages for each set of exposure conditions including said optimum exposure conditions, based on said reflected light intensity measured in said sub-step of measuring reflected light intensity on said test substrate; comprises selecting exposure conditions for said test substrate, which provide a set of transmitting portion percentages equal or close to said set of transmitting portion percentages presenting said optimum exposure conditions, as provisional exposure conditions; and comprises then measuring reflected light intensity on said resolvable regions and said unsolvable regions in a developed pattern, which corresponds to exposure conditions close to said provisional optimum exposure conditions, in order to obtain a set of transmitting portion percentages corresponding to exposure conditions closer to said provisional optimum exposure conditions, and to repeat renewal of said provisional optimum exposure conditions, until said set of transmitting portion percentages presenting said optimum exposure conditions is obtained.

14. The method for determining exposure conditions according to claim 11, wherein said sub-step of measuring reflected light intensity on said preliminary substrate comprises measuring reflected light intensity on portions respectively corresponding to said plurality of regions of the predetermined pattern of said mask, which each of said developed patterns on said preliminary substrate has, said sub-step of measuring reflected light intensity on said test substrate comprises measuring reflected light intensity on portions respectively corresponding to said plurality of regions of the predetermined pattern of said mask, which each of said developed patterns on said test substrate has, and said sub-step of comparing said reflected light intensity on said test substrate comprises selecting exposure conditions, which correspond to a set of transmitting portion percentages equal or close to said set of transmitting portion percentages presenting said optimum exposure conditions for said preliminary substrate, as optimum exposure conditions for said test substrate, from sets of transmitting portion percentages of said developed patterns on said test substrate obtained by comparing said reflected light intensity on said developed patterns on said test substrate with upper and lower limits of said reflected light intensity data in said database.

15. The method for determining exposure conditions according to claim 14, wherein a sub-step of measuring reflected light intensity on a test substrate, included in a step of determining optimum exposure conditions for said test substrate from the second time after construction of said database, comprises measuring reflected light intensity on developed patterns on said test substrate corresponding to 1 to 30 sets of exposure conditions equal or close to the latest optimum exposure conditions obtained by a step of determining optimum exposure conditions for a test substrate for the last time.

16. The method for determining exposure conditions according to claim 14, wherein said step of constructing a database further comprises a sub-step of setting, as alarm values, upper and lower limits of reflected light intensity on said resolvable regions in developed patterns, which correspond to said optimum exposure conditions obtained by said SEM observation on said preliminary substrate, and said step of determining optimum exposure conditions for said test substrate further comprises a sub-step of emitting an alarm when reflected light intensity on said resolvable regions, which correspond to optimum exposure conditions obtained for said test substrate, deviates from a range of said alarm values.

17. A processing system comprising a developing section, which performs a developing treatment on a substrate subjected to an exposure treatment, and an apparatus for determining exposure conditions, which determines optimum exposure conditions of said exposure treatment while using a test substrate,
  wherein said apparatus for determining exposure conditions comprises
  a light irradiating section, which irradiates a predetermined range of developed patterns formed on said test substrate by the developing treatment in said developing section, with light having a predetermined intensity,
  a light-measuring section, which measures reflected light intensity on a predetermined region within said predetermined range, and
  an arithmetic process section, which determines optimum exposure conditions for said test substrate, based on said reflected light intensity,
  wherein said arithmetic process section comprises
  a database having data obtained in advance and including combination data of exposure amounts and focus values respectively for a plurality of different positions of a preliminary substrate other than said test substrate, wherein said combination data consists of different exposure amounts and focus values used to expose said positions of said preliminary substrate to light with a mask having said predetermined pattern; shape data by SEM observation on a plurality of developed patterns obtained by developing said preliminary substrate; and reflected light intensity data obtained by irradiating said developed patterns on said preliminary substrate with light having said predetermined intensity, wherein said combination data, said shape data, and said reflected light intensity data are mutually correlated to provide optimum exposure conditions for said preliminary substrate from combinations of the exposure amounts and focus values based on said shape data, and
  an arithmetic unit, which compares reflected light intensity measured on said developed patterns on said test substrate with said reflected light intensity data in said database to search for optimum exposure conditions for said test substrate.

18. The processing system according to claim 17, wherein said light-measuring section includes a CCD camera or a line sensor and signal converting means for converting a image signal of said predetermined region picked up by said CCD camera or line sensor into optical information.

19. The processing system according to claim 17, wherein said light irradiating section includes a narrow band wavelength light source and an optical fiber for transmitting light coming from said narrow band width wavelength light source toward said test substrate.

20. The processing system according to claim 17, wherein said light irradiating section includes a light source having a plurality of narrow band wavelength light sources differing from each other in wavelength and an optical fiber for transmitting light coming from said light source toward said test substrate, and a suitable narrow band wavelength light source is selected for use from said narrow band wavelength light sources in accordance with the predetermined pattern of said mask.

21. A processing system comprising:
  a resist coating section, which forms a resist film on a substrate;
  an exposure apparatus, which performs an exposure treatment on the substrate having said resist film formed thereon;
  a developing section, which performs a developing treatment on the substrate subjected to said exposure treatment;
  an apparatus for determining exposure conditions while using a test substrate, which determines optimum exposure conditions for said test substrate and feeds said optimum exposure conditions back to said exposure apparatus, based on reflected light intensity on developed patterns formed by exposing different positions of said test substrate to light with a mask having a predetermined pattern at different exposure amounts and focus values and performing development thereon,
  wherein said apparatus for determining exposure conditions comprises
  a light irradiating section, which irradiates a predetermined range of said developed patterns on said test substrate with light having a predetermined intensity,
  a light-measuring section, which measures reflected light intensity on a predetermined region within said predetermined range,
  an arithmetic process section, which searches for optimum exposure conditions for said test substrate, based on reflected light intensity measured by said light-measuring section, and
  a signal transmitting section, which feeds optimum exposure conditions determined by said arithmetic process section back to said exposure apparatus,
  wherein said arithmetic process section comprises
  a database having data obtained in advance and including combination data of exposure amounts and focus values respectively for a plurality of different positions of a preliminary substrate other than said test substrate, wherein said combination data consists of different exposure amounts and focus values used to expose said positions of said preliminary substrate to light with said mask; shape data by SEM observation on a plurality of developed patterns obtained by developing said preliminary substrate; and reflected light intensity data obtained by irradiating said developed patterns on said preliminary substrate with light having said predetermined intensity, wherein said combination data, said shape data, and said reflected light intensity data are mutually correlated to provide optimum exposure conditions for said preliminary substrate from said combination data based on said shape data, and
  an arithmetic unit, which compares reflected light intensity measured on said developed patterns on said test substrate with said reflected light intensity data in said database to search for optimum exposure conditions for said test substrate.

22. The processing system according to claim 21, wherein said resist coating section, said developing section, and said apparatus for determining exposure conditions are arranged in a single box.

23. The processing system according to claim 21, wherein said light-measuring section includes a CCD camera or a line sensor and signal converting means for converting a image signal of said predetermined region picked up by said CCD camera or line sensor into optical information.

24. The processing system according to claim 21, wherein said light irradiating section includes a narrow band wavelength light source and an optical fiber for transmitting light coming from said narrow band width wavelength light source toward said test substrate.

25. The processing system according to claim 21, wherein said light irradiating section includes a light source having a plurality of narrow band wavelength light sources differing from each other in wavelength and an optical fiber for transmitting light coming from said light source toward said test substrate, and a suitable narrow band wavelength light source is selected for use from said narrow band wavelength light sources in accordance with the predetermined pattern of said mask.

26. A processing system comprising:

a resist coating section, which forms a resist film on a substrate;

a developing section, which performs a developing treatment on the substrate subjected to an exposure treatment; and an apparatus for determining exposure conditions while using a test substrate, which determines optimum exposure conditions for said test substrate, based on reflected light intensity on developed patterns formed by exposing different positions of said test substrate to light with a mask having a predetermined pattern at different exposure amounts and focus values and performing development thereon, wherein said apparatus for determining exposure conditions comprises a light irradiating section, which irradiates a predetermined range of said developed patterns on said test substrate with light having a predetermined intensity, a light-measuring section, which measures reflected light intensity on a predetermined region within said predetermined range, and an arithmetic process section, which searches for optimum exposure conditions for said test substrate, based on reflected light intensity measured by said light-measuring section, wherein said arithmetic process section comprises a database having data obtained in advance and including combination data of exposure amounts and focus values respectively for a plurality of different positions of a preliminary substrate other than said test substrate, wherein said combination data consists of different exposure amounts and focus values used to expose said positions of said preliminary substrate to light with said mask; shape data by SEM observation on a plurality of developed patterns obtained by developing said preliminary substrate; and reflected light intensity data obtained by irradiating said developed patterns on said preliminary substrate with light having said predetermined intensity, wherein said combination data, said shape data, and said reflected light intensity data are mutually correlated to provide optimum exposure conditions for said preliminary substrate from said combination data based on said shape data, and an arithmetic unit, which compares reflected light intensity measured on said developed patterns on said test substrate with said reflected light intensity data in said database to search for optimum exposure conditions for said test substrate.

27. A processing system comprising:

a resist coating section, which forms a resist film on a substrate;

a developing section, which performs a developing treatment on the substrate subjected to an exposure treatment;

an apparatus for measuring reflected light intensity while using a test substrate, which irradiate s a predetermined range of developed patterns on said test substrate with light having a predetermined intensity, and measures reflected light intensity thereon, wherein said developed patterns on said test substrate are formed by forming a predetermined resist film on said test substrate by said resist coating section, and performing the developing treatment on said test substrate by said developing section; and a coating/developing controller, which has a database obtained in advance and including data of reflected light intensity measured by irradiating a predetermined range of developed patterns on each of a plurality of preliminary substrates other than said test substrate with light having said predetermined intensity, wherein said developed patterns on each of said plurality of preliminary substrates are formed with different process conditions, said coating/developing controller being arranged to compare said data of reflected light intensity in said database with said reflected light intensity on said test substrate in order to determine optimum process conditions in said resist coating section and/or said developing section, and to feed the determined process conditions back to said resist coating section and/or said developing section.

* * * * *